United States Patent
Ganeshkumar

(10) Patent No.: US 10,499,139 B2
(45) Date of Patent: *Dec. 3, 2019

(54) AUDIO SIGNAL PROCESSING FOR NOISE REDUCTION

(71) Applicant: BOSE CORPORATION, Framingham, MA (US)

(72) Inventor: Alaganandan Ganeshkumar, North Attleboro, MA (US)

(73) Assignee: Bose Corporation, Framingham, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/925,211

(22) Filed: Mar. 19, 2018

(65) Prior Publication Data

US 2018/0270565 A1 Sep. 20, 2018

Related U.S. Application Data

(63) Continuation-in-part of application No. 15/463,368, filed on Mar. 20, 2017.

(51) Int. Cl.
*H04R 1/10* (2006.01)
*G10L 21/0232* (2013.01)
(Continued)

(52) U.S. Cl.
CPC ........ *H04R 1/1083* (2013.01); *G10L 21/0205* (2013.01); *G10L 21/0208* (2013.01);
(Continued)

(58) Field of Classification Search
CPC .... H04R 3/005; H04R 1/406; H04R 2430/20; H04R 2201/401; H04R 2410/01;
(Continued)

(56) References Cited

U.S. PATENT DOCUMENTS

| 6,339,706 B1 | 1/2002 | Tillgren et al. |
| 6,363,349 B1 | 3/2002 | Urs et al. |

(Continued)

FOREIGN PATENT DOCUMENTS

| EP | 2884763 A1 | 6/2015 |
| EP | 2914016 A1 | 9/2015 |

(Continued)

OTHER PUBLICATIONS

International Search Report and Written Opinion in application No. PCT/US2018/035040 dated Aug. 27, 2018.

(Continued)

*Primary Examiner* — Norman Yu
(74) *Attorney, Agent, or Firm* — Bose Corporation

(57) ABSTRACT

Audio device systems and methods are provided to enhance speech pick-up from a user. The systems and methods receive signals from a plurality of microphones coupled to one or more earpieces. The signals are processed using a first array processing technique to enhance their acoustic response from a selected direction, such as a direction of the user's mouth, to provide a primary signal. The signals are also processed using a second array processing technique to enhance response from the selected direction, to provide a secondary signal. The primary signal and the secondary signal are compared, and a selected signal is provided based upon the primary signal, the secondary signal, and the comparison.

18 Claims, 12 Drawing Sheets

(51) Int. Cl.
  *H03G 5/16* (2006.01)
  *H04R 3/00* (2006.01)
  *G10L 25/84* (2013.01)
  *G10L 21/02* (2013.01)
  *G10L 25/51* (2013.01)
  *G10L 21/0208* (2013.01)
  *G10L 25/21* (2013.01)
  *H04R 1/40* (2006.01)
  *G10L 21/0216* (2013.01)
  *H04R 5/033* (2006.01)

(52) U.S. Cl.
  CPC .......... *G10L 21/0232* (2013.01); *G10L 25/51* (2013.01); *G10L 25/84* (2013.01); *H03G 5/165* (2013.01); *H04R 3/005* (2013.01); *G10L 25/21* (2013.01); *G10L 2021/02166* (2013.01); *H04R 1/406* (2013.01); *H04R 5/033* (2013.01); *H04R 2201/107* (2013.01); *H04R 2410/07* (2013.01); *H04R 2430/03* (2013.01); *H04R 2430/25* (2013.01)

(58) Field of Classification Search
  CPC .... H04R 1/1083; H04R 25/407; H04R 5/033; H04R 2430/23; H04R 2430/25; H04R 29/005; H04R 1/326; H04R 2201/403; H04R 2460/01; H04R 25/405; H04R 2203/12; H04R 2410/05; H04R 2430/21; H04R 1/10; H04R 1/32; H04R 25/43; H04R 2201/107; H04R 2410/07; H04R 2430/03; H03G 5/165; G10L 2021/02166; G10L 21/0208; G10L 21/0216; G10L 21/0272; G10L 25/78; G10L 2021/02165; G10L 15/25; G10L 21/0205; G10L 21/0232; G10L 25/51; G10L 25/84; G10K 2210/111
  USPC ................ 381/26, 309, 317, 71.6, 71.11, 92, 381/94.1–94.3, 94.7, 110, 122, 74
  See application file for complete search history.

(56) References Cited

U.S. PATENT DOCUMENTS

| | | | |
|---|---|---|---|
| 6,453,291 B1 | 9/2002 | Ashley | |
| 7,103,550 B2 | 9/2006 | Gallagher et al. | |
| 7,412,070 B2 | 8/2008 | Kleinschmidt et al. | |
| 8,184,822 B2 | 5/2012 | Carreras et al. | |
| 8,611,560 B2 | 12/2013 | Goldstein et al. | |
| 8,620,650 B2 | 12/2013 | Walters et al. | |
| 8,625,819 B2 | 1/2014 | Goldstein et al. | |
| 8,626,246 B2 | 1/2014 | Shostak | |
| 8,798,283 B2 | 8/2014 | Gauger, Jr. et al. | |
| 8,805,692 B2 | 8/2014 | Goldstein | |
| 8,880,396 B1 | 11/2014 | Laroche et al. | |
| 9,066,167 B2 | 6/2015 | Goldstein et al. | |
| 9,076,447 B2 | 7/2015 | Nandy et al. | |
| 9,204,214 B2 | 12/2015 | Usher et al. | |
| 9,401,158 B1 | 7/2016 | Yen et al. | |
| 9,832,569 B1 | 11/2017 | Ayrapetian et al. | |
| 9,843,861 B1 | 12/2017 | Termeulen | |
| 2005/0152559 A1 | 7/2005 | Gierl et al. | |
| 2007/0172079 A1 | 7/2007 | Christoph | |
| 2008/0031475 A1 | 2/2008 | Goldstein | |
| 2009/0121934 A1* | 5/2009 | Sugiyama | G01S 3/04 342/372 |
| 2009/0304188 A1 | 12/2009 | Mejia et al. | |
| 2012/0020480 A1 | 1/2012 | Visser et al. | |
| 2012/0057722 A1 | 3/2012 | Osako et al. | |
| 2014/0081644 A1 | 3/2014 | Usher et al. | |
| 2014/0093091 A1* | 4/2014 | Dusan | H04R 1/1083 381/74 |
| 2014/0095157 A1 | 4/2014 | Usher et al. | |
| 2014/0119557 A1 | 5/2014 | Goldstein | |
| 2014/0119558 A1 | 5/2014 | Goldstein | |
| 2014/0119559 A1 | 5/2014 | Goldstein | |
| 2014/0119574 A1 | 5/2014 | Goldstein | |
| 2014/0122073 A1 | 5/2014 | Goldstein | |
| 2014/0122092 A1 | 5/2014 | Goldstein | |
| 2014/0123008 A1 | 5/2014 | Goldstein | |
| 2014/0123009 A1 | 5/2014 | Goldstein | |
| 2014/0123010 A1 | 5/2014 | Goldstein | |
| 2014/0244273 A1 | 8/2014 | Laroche et al. | |
| 2014/0268016 A1 | 9/2014 | Chow et al. | |
| 2014/0278393 A1 | 9/2014 | Ivanov et al. | |
| 2014/0350943 A1 | 11/2014 | Goldstein | |
| 2015/0112689 A1 | 4/2015 | Nandy et al. | |
| 2015/0139428 A1 | 5/2015 | Reining et al. | |
| 2015/0230026 A1 | 8/2015 | Eichfeld et al. | |
| 2015/0334484 A1 | 11/2015 | Usher et al. | |
| 2016/0088391 A1 | 3/2016 | Usher et al. | |
| 2016/0098921 A1 | 4/2016 | Qutub et al. | |
| 2016/0162469 A1 | 6/2016 | Santos | |
| 2016/0165361 A1 | 6/2016 | Miller et al. | |
| 2016/0189220 A1 | 6/2016 | Verma | |
| 2016/0196838 A1 | 7/2016 | Rossum et al. | |
| 2016/0210051 A1 | 7/2016 | Qutub et al. | |
| 2016/0267899 A1 | 9/2016 | Gauger, Jr. et al. | |
| 2017/0263267 A1 | 9/2017 | Dusan et al. | |

FOREIGN PATENT DOCUMENTS

| | | |
|---|---|---|
| EP | 3007170 A1 | 4/2016 |
| WO | 2009132646 A1 | 11/2009 |
| WO | 201694418 A1 | 6/2016 |
| WO | 2016089745 A1 | 6/2016 |

OTHER PUBLICATIONS

International Search Report and Written Opinion in application No. PCT/US2018/023136 dated Jul. 26, 2018.
Gillett, P.W. "Head Mounted Microphone Arrays" (2009), Blacksburg, VA. Retrieved from the Internet: https://vtechworks.lib.vt.edu/bitstream/handle/10919/28867/GillettDissertation2.pdf?sequence=1 &isAllowed=y.
International Search Report and Written Opinion in PCT/US2018/023072 dated Jun. 6, 2018.

* cited by examiner

AUDIO SIGNAL PROCESSING FOR NOISE REDUCTION

CROSS-REFERENCE TO RELATED APPLICATIONS

This application claims the benefit of an earlier filing date under 35 U.S.C. § 120 as a continuation-in-part of co-pending U.S. patent application Ser. No. 15/463,368 filed on Mar. 20, 2017, titled AUDIO SIGNAL PROCESSING FOR NOISE REDUCTION, which is incorporated herein by reference in its entirety for all purposes.

BACKGROUND

Headphone systems are used in numerous environments and for various purposes, examples of which include entertainment purposes such as gaming or listening to music, productive purposes such as phone calls, and professional purposes such as aviation communications or sound studio monitoring, to name a few. Different environments and purposes may have different requirements for fidelity, noise isolation, noise reduction, voice pick-up, and the like. Some environments require accurate communication despite high background noise, such as environments involving industrial equipment, aviation operations, and sporting events. Some applications exhibit increased performance when a user's voice is more clearly separated, or isolated, from other noises, such as voice communications and voice recognition, including voice recognition for communications, e.g., speech-to-text for short message service (SMS), i.e., texting, or virtual personal assistant (VPA) applications.

Accordingly, in some environments and in some applications it may be desirable for enhanced capture or pick-up of a user's voice from among other acoustic sources in the vicinity of a headphone or headset, to reduce signal components that are not due to the user's voice.

SUMMARY OF THE INVENTION

Aspects and examples are directed to headphone systems and methods that pick-up speech activity of a user and reduce other acoustic components, such as background noise and other talkers, to enhance the user's speech components over other acoustic components. The user wears a headphone set, and the systems and methods provide enhanced isolation of the user's voice by removing audible sounds that are not due to the user speaking. Noise-reduced voice signals may be beneficially applied to audio recording, communications, voice recognition systems, virtual personal assistants (VPA), and the like. Aspects and examples disclosed herein allow a headphone to pick-up and enhance a user's voice so the user may use such applications with improved performance and/or in noisy environments.

According to one aspect, a headphone is provided that includes a plurality of microphones coupled to one or more earpieces to provide a plurality of signals, and one or more processors configured to receive the plurality of signals, process the plurality of signals using a first array processing technique to enhance response from a selected direction to provide a primary signal, process the plurality of signals using a second array processing technique to enhance response from the selected direction to provide a secondary signal, compare the primary signal and the secondary signal, and provide a selected signal based upon the primary signal, the secondary signal, and the comparison.

In some examples, the one or more processors is further configured to compare the primary signal and the secondary signal by signal energies. The one or more processors may be further configured to make a threshold comparison of signal energies, the threshold comparison being a determination whether one of the primary signal or the secondary signal has a signal energy less than a threshold amount of a signal energy of the other. The one or more processors may be further configured to select the one of the primary signal and the secondary signal having the lesser signal energy, by threshold comparison, to be provided as the selected signal. In certain examples, the one or more processors is further configured to apply equalization to at least one of the primary signal and the secondary signal prior to comparing signal energies.

In various examples, the one or more processors is further configured to indicate a wind condition based upon the comparison. In certain examples, the first array processing technique is a super-directive beamforming technique and the second array processing technique is a delay-and-sum technique, and the one or more processors is further configured to determine that the wind condition exists based upon a signal energy of the primary signal exceeding a threshold signal energy, the threshold signal energy being based upon a signal energy of the secondary signal.

In some examples, the one or more processors is further configured to process the plurality of signals to reduce response from the selected direction to provide a reference signal and to subtract, from the selected signal, components correlated to the reference signal.

According to another aspect, a method of enhancing speech of a headphone user is provided and includes receiving a plurality of microphone signals, array processing the plurality of signals by a first array technique to enhance acoustic response from a direction of the user's mouth to generate a first primary signal, array processing the plurality of signals by a second array technique to enhance acoustic response from a direction of the user's mouth to generate a second primary signal, comparing the first primary signal to the second primary signal, and providing a selected primary signal based upon the first primary signal, the second primary signal, and the comparison.

In various examples, comparing the first primary signal to the second primary signal comprises comparing signal energies of the first primary signal and the second primary signal.

In some examples, providing the selected primary signal based upon the comparison comprises providing a selected one of the first primary signal and the second primary signal having a signal energy less than a threshold amount of the other of the first primary signal and the second primary signal.

Certain examples include equalizing at least one of the first primary signal and the second primary signal prior to comparing signal energies.

Some examples include determining that a wind condition exists based upon the comparison and setting an indicator that the wind condition exists. In certain examples, the first array technique is a super-directive beamforming technique and the second array technique is a delay-and-sum technique, and determining that a wind condition exists comprises determining that a signal energy of the first primary signal exceeds a threshold signal energy, the threshold signal energy being based upon a signal energy of the second primary signal.

Various examples include array processing the plurality of signals to reduce acoustic response from a direction of the user's mouth to generate a noise reference signal, filtering the noise reference signal to generate a noise estimate signal, and subtracting the noise estimate signal from the selected primary signal.

According to another aspect, a headphone system is provided that includes a plurality of left microphones coupled to a left earpiece to provide a plurality of left signals, a plurality of right microphones coupled to a right earpiece to provide a plurality of right signals, and one or more processors configured to combine the plurality of left signals to enhance acoustic response from a direction of the user's mouth to generate a left primary signal, combine the plurality of left signals to enhance acoustic response from the direction of the user's mouth to generate a left secondary signal, combine the plurality of right signals to enhance acoustic response from the direction of the user's mouth to generate a right primary signal, combine the plurality of right signals to enhance acoustic response from the direction of the user's mouth to generate a right secondary signal, compare the left primary signal and the left secondary signal, compare the right primary signal and the right secondary signal, provide a left signal based upon the left primary signal, the left secondary signal, and the comparison of the left primary signal and the left secondary signal, and provide a right signal based upon the right primary signal, the right secondary signal, and the comparison of the right primary signal and the right secondary signal.

In some examples, the one or more processors is further configured to compare the left primary signal and the left secondary signal by signal energies, and to compare the right primary signal and the right secondary signal by signal energies.

In certain examples, the one or more processors is further configured to make a threshold comparison of signal energies, a threshold comparison being a determination whether a first signal has a signal energy less than a threshold amount of a signal energy of a second signal. In some examples, the threshold comparison comprises equalizing at least one of the first signal and the second signal prior to comparing signal energies.

In various examples, the one or more processors may be further configured to indicate a wind condition in either of a left or right side based upon at least one of the comparisons.

Still other aspects, examples, and advantages of these exemplary aspects and examples are discussed in detail below. Examples disclosed herein may be combined with other examples in any manner consistent with at least one of the principles disclosed herein, and references to "an example," "some examples," "an alternate example," "various examples," "one example" or the like are not necessarily mutually exclusive and are intended to indicate that a particular feature, structure, or characteristic described may be included in at least one example. The appearances of such terms herein are not necessarily all referring to the same example.

BRIEF DESCRIPTION OF THE DRAWINGS

Various aspects of at least one example are discussed below with reference to the accompanying figures, which are not intended to be drawn to scale. The figures are included to provide illustration and a further understanding of the various aspects and examples, and are incorporated in and constitute a part of this specification, but are not intended as a definition of the limits of the invention. In the figures, identical or nearly identical components illustrated in various figures may be represented by a like numeral. For purposes of clarity, not every component may be labeled in every figure. In the figures.

DETAILED DESCRIPTION

Figure 1:
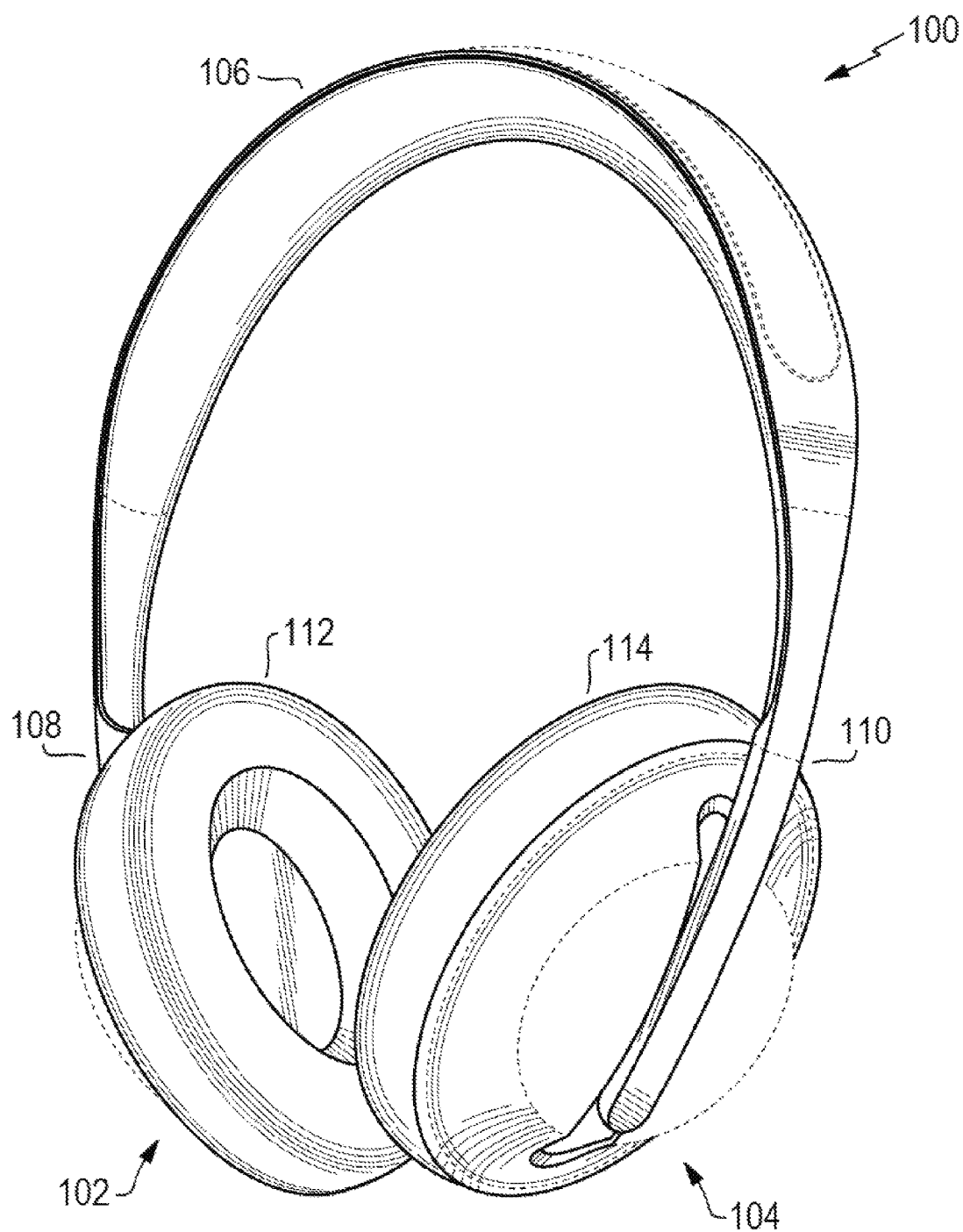
FIG. 1 is a perspective view of an example headphone set.

Aspects of the present disclosure are directed to headphone systems and methods that pick-up a voice signal of the user (e.g., wearer) of a headphone while reducing or removing other signal components not associated with the user's voice. Attaining a user's voice signal with reduced noise components may enhance voice-based features or functions available as part of the headphone set or other associated equipment, such as communications systems (cellular, radio, aviation), entertainment systems (gaming), speech recognition applications (speech-to-text, virtual personal assistants), and other systems and applications that process audio, especially speech or voice. Examples disclosed herein may be coupled to, or placed in connection with, other systems, through wired or wireless means, or may be independent of other systems or equipment.

The headphone systems disclosed herein may include, in some examples, aviation headsets, telephone headsets, media headphones, and network gaming headphones, or any combination of these or others. Throughout this disclosure the terms "headset," "headphone," and "headphone set" are used interchangeably, and no distinction is meant to be made by the use of one term over another unless the context clearly indicates otherwise. Additionally, aspects and examples in accord with those disclosed herein, in some circumstances, may be applied to earphone form factors (e.g., in-ear transducers, earbuds), and/or off-ear acoustic devices, e.g., devices worn in the vicinity of the wearer's ears, neck-worn form factors or other form factors on the head or body, e.g., shoulders, or form factors that include one or more drivers (e.g., loudspeakers) directed generally toward a wearer's ear(s) without an adjacent coupling to the wearer's head or ear(s). All such form factors, and similar, are contemplated by the terms "headset," "headphone," and "headphone set." Accordingly, any on-ear, in-ear, over-ear, or off-ear form-factors of personal acoustic devices are intended to be included by the terms "headset," "headphone," and "headphone set." The terms "earpiece" and/or "earcup" may include any portion of such form factors intended to operate in proximity to at least one of a user's ears.

Examples disclosed herein may be combined with other examples in any manner consistent with at least one of the principles disclosed herein, and references to "an example," "some examples," "an alternate example," "various examples," "one example" or the like are not necessarily mutually exclusive and are intended to indicate that a particular feature, structure, or characteristic described may be included in at least one example. The appearances of such terms herein are not necessarily all referring to the same example.

It is to be appreciated that examples of the methods and apparatuses discussed herein are not limited in application to the details of construction and the arrangement of components set forth in the following description or illustrated in the accompanying drawings. The methods and apparatuses are capable of implementation in other examples and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, right and left, top and bottom, upper and lower, and vertical and horizontal are intended for convenience of description, not to limit the present systems and methods or their components to any one positional or spatial orientation.

FIG. 1 illustrates one example of a headphone set. The headphones 100 include two earpieces, i.e., a right earcup 102 and a left earcup 104, coupled to a right yoke assembly 108 and a left yoke assembly 110, respectively, and intercoupled by a headband 106. The right earcup 102 and left earcup 104 include a right circumaural cushion 112 and a left circumaural cushion 114, respectively. While the example headphones 100 are shown with earpieces having circumaural cushions to fit around or over the ear of a user, in other examples the cushions may sit on the ear, or may include earbud portions that protrude into a portion of a user's ear canal, or may include alternate physical arrangements. As discussed in more detail below, either or both of the earcups 102, 104 may include one or more microphones. Although the example headphones 100 illustrated in FIG. 1 include two earpieces, some examples may include only a single earpiece for use on one side of the head only. Additionally, although the example headphones 100 illustrated in FIG. 1 include a headband 106, other examples may include different support structures to maintain one or more earpieces (e.g., earcups, in-ear structures, etc.) in proximity to a user's ear, e.g., an earbud may include a shape and/or materials configured to hold the earbud within a portion of a user's ear, or a personal speaker system may include a neckband to support and maintain acoustic driver(s) near the user's ears, shoulders, etc.

Figure 2:
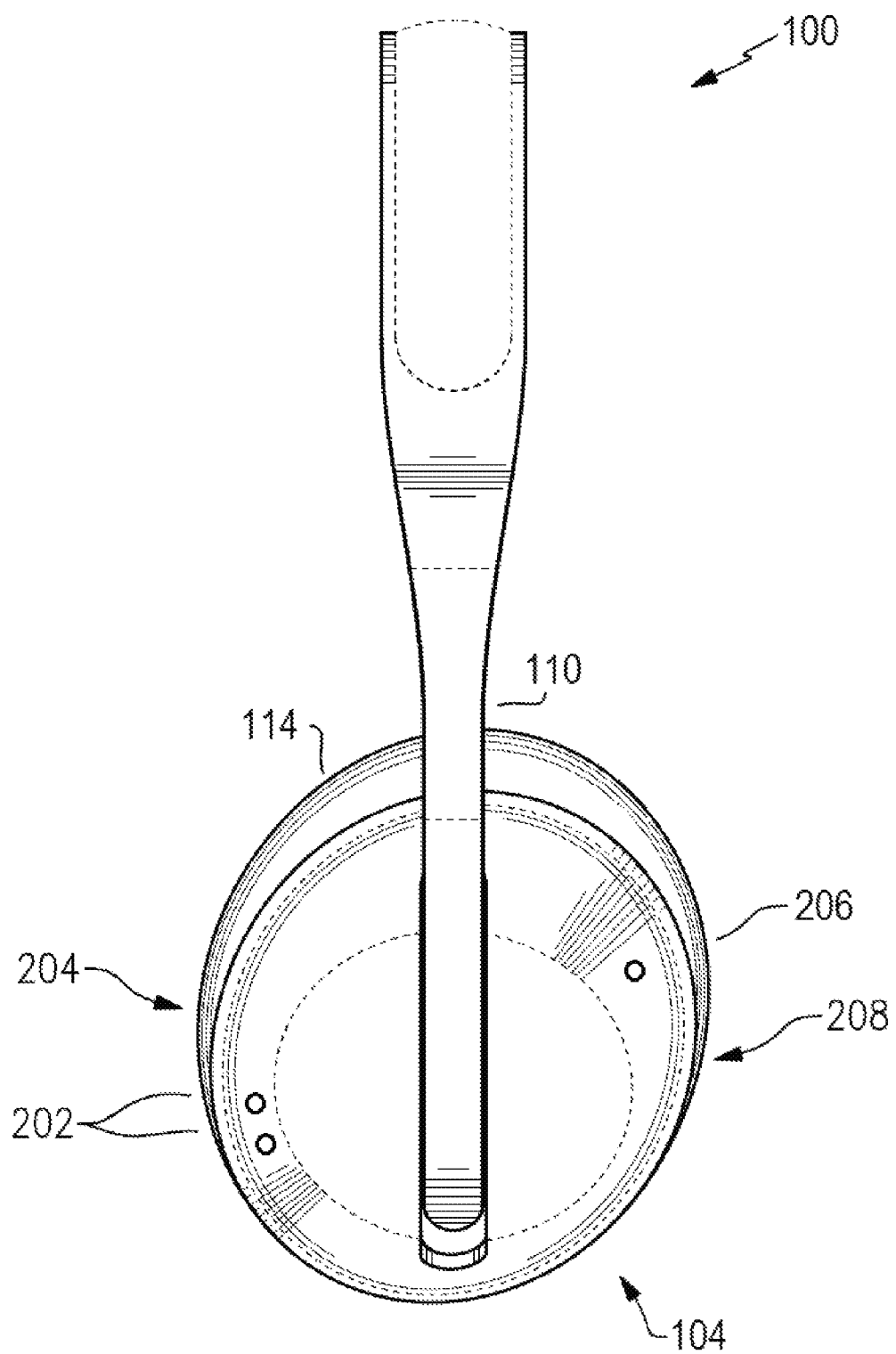
FIG. 2 is a left-side view of an example headphone set.

FIG. 2 illustrates the headphones 100 from the left side and shows details of the left earcup 104 including a pair of front microphones 202, which may be nearer a front edge 204 of the earcup, and a rear microphone 206, which may be nearer a rear edge 208 of the earcup. The right earcup 102 may additionally or alternatively have a similar arrangement of front and rear microphones, though in examples the two earcups may have a differing arrangement in number or placement of microphones. Additionally, various examples may have more or fewer front microphones 202 and may have more, fewer, or no rear microphones 206. While microphones are illustrated in the various figures and labeled with reference numerals, such as reference numerals 202, 206 the visual element illustrated in the figures may, in some examples, represent an acoustic port wherein acoustic signals enter to ultimately reach a microphone 202, 206 which may be internal and not physically visible from the exterior. In examples, one or more of the microphones 202, 206 may be immediately adjacent to the interior of an acoustic port, or may be removed from an acoustic port by a distance, and may include an acoustic waveguide between an acoustic port and an associated microphone.

Signals from the microphones are combined with array processing to advantageously steer beams and nulls in a manner that maximizes the user's voice in one instance to provide a primary signal, and minimizes the user's voice in another instance to provide a reference signal. The reference signal is correlated to the surrounding environmental noise and is provided as a reference to an adaptive filter. The adaptive filter modifies the primary signal to remove components that correlate to the reference signal, e.g., the noise correlated signal, and the adaptive filter provides an output signal that approximates the user's voice signal. Additional processing may occur as discussed in more detail below, and microphone signals from both right and left sides (i.e., binaural), may be combined, also as discussed in more detail below. Further, signals may be advantageously processed in different sub-bands to enhance the effectiveness of the noise reduction, i.e. enhancement of the user's speech over the noise. Production of a signal wherein a user's voice components are enhanced while other components are reduced is referred to generally herein as voice pick-up, voice selection, voice isolation, speech enhancement, and the like. As used herein, the terms "voice," "speech," "talk," and variations thereof are used interchangeably and without regard for whether such speech involves use of the vocal folds.

Examples to pick-up a user's voice may operate or rely on various principles of the environment, acoustics, vocal characteristics, and unique aspects of use, e.g., an earpiece worn or placed on each side of the head of a user whose voice is to be detected. For example, in a headset environment, a user's voice generally originates at a point symmetric to the right and left sides of the headset and will arrive at both a right front microphone and a left front microphone with substantially the same amplitude at substantially the same time with substantially the same phase, whereas background noise, including speech from other people, will tend to be asymmetrical between the right and left, having variation in amplitude, phase, and time.

Figure 3:
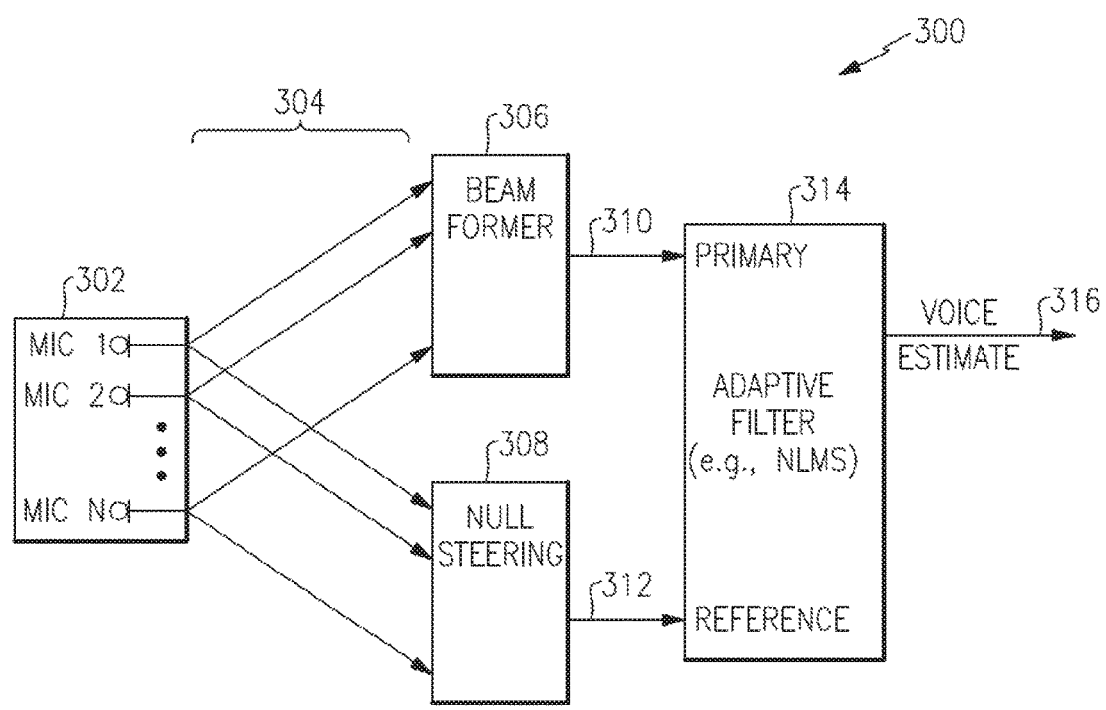
FIG. 3 is a schematic diagram of an example system to enhance a user's voice signal among other acoustic signals.

FIG. 3 is a block diagram of an example signal processing system 300 that processes microphone signals to produce an output signal that includes a user's voice component enhanced with respect to background noise and other talkers. A set of multiple microphones 302 convert acoustic energy into electronic signals 304 and provide the signals 304 to each of two array processors 306, 308. The signals 304 may be in analog form. Alternately, one or more analog-to-digital converters (ADC) (not shown) may first convert the microphone outputs so that the signals 304 may be in digital form.

The array processors 306, 308 apply array processing techniques, such as phased array, delay-and-sum techniques, and may utilize minimum variance distortionless response (MVDR) and linear constraint minimum variance (LCMV) techniques, to adapt a responsiveness of the set of microphones 302 to enhance or reject acoustic signals from various directions. Beam forming enhances acoustic signals from a particular direction, or range of directions, while null steering reduces or rejects acoustic signals from a particular direction or range of directions.

The first array processor 306 is a beam former that works to maximize acoustic response of the set of microphones 302 in the direction of the user's mouth (e.g., directed to the front of and slightly below an earcup), and provides a primary signal 310. Because of the beam forming array processor 306, the primary signal 310 includes a higher signal energy due to the user's voice than any of the individual microphone signals 304.

The second array processor 308 steers a null toward the user's mouth and provides a reference signal 312. The reference signal 312 includes minimal, if any, signal energy due to the user's voice because of the null directed at the user's mouth. Accordingly, the reference signal 312 is composed substantially of components due to background noise and acoustic sources not due to the user's voice, i.e., the reference signal 312 is a signal correlated to the acoustic environment without the user's voice.

In certain examples, the array processor 306 is a superdirective near-field beam former that enhances acoustic response in the direction of the user's mouth, and the array processor 308 is a delay-and-sum algorithm that steers a null, i.e., reduces acoustic response, in the direction of the user's mouth.

The primary signal 310 includes a user's voice component and includes a noise component (e.g., background, other talkers, etc.) while the reference signal 312 includes substantially only a noise component. If the reference signal 312 were nearly identical to the noise component of the primary signal 310, the noise component of the primary signal 310 could be removed by simply subtracting the reference signal 312 from the primary signal 310. In practice, however, the noise component of the primary signal 310 and the reference signal 312 are not identical. Instead, the reference signal 312 is correlated to the noise component of the primary signal 310, as will be understood by one of skill in the art, and thus adaptive filtration may be used to remove at least some of the noise component from the primary signal 310, by using the reference signal 312 that is correlated to the noise component.

The primary signal 310 and the reference signal 312 are provided to, and are received by, an adaptive filter 314 that seeks to remove from the primary signal 310 components not associated with the user's voice. Specifically, the adaptive filter 314 seeks to remove components that correlate to the reference signal 312. Numerous adaptive filters, known in the art, are designed to remove components correlated to a reference signal. For example, certain examples include a normalized least mean square (NLMS) adaptive filter, or a recursive least squares (RLS) adaptive filter. The output of the adaptive filter 314 is a voice estimate signal 316, which represents an approximation of a user's voice signal.

Example adaptive filters 314 may include various types incorporating various adaptive techniques, e.g., NLMS, RLS. An adaptive filter generally includes a digital filter that receives a reference signal correlated to an unwanted component of a primary signal. The digital filter attempts to generate from the reference signal an estimate of the unwanted component in the primary signal. The unwanted component of the primary signal is, by definition, a noise component. The digital filter's estimate of the noise component is a noise estimate. If the digital filter generates a good noise estimate, the noise component may be effectively removed from the primary signal by simply subtracting the noise estimate. On the other hand, if the digital filter is not generating a good estimate of the noise component, such a subtraction may be ineffective or may degrade the primary signal, e.g., increase the noise. Accordingly, an adaptive algorithm operates in parallel to the digital filter and makes adjustments to the digital filter in the form of, e.g., changing weights or filter coefficients. In certain examples, the adaptive algorithm may monitor the primary signal when it is known to have only a noise component, i.e., when the user is not talking, and adapt the digital filter to generate a noise estimate that matches the primary signal, which at that moment includes only the noise component.

The adaptive algorithm may know when the user is not talking by various means. In at least one example, the system enforces a pause or a quiet period after triggering speech enhancement. For example, the user may be required to press a button or speak a wake-up command and then pause until the system indicates to the user that it is ready. During the required pause the adaptive algorithm monitors the primary signal, which does not include any user speech, and adapts the filter to the background noise. Thereafter when the user speaks the digital filter generates a good noise estimate, which is subtracted from the primary signal to generate the voice estimate, for example, the voice estimate signal 316.

In some examples an adaptive algorithm may substantially continuously update the digital filter and may freeze the filter coefficients, e.g., pause adaptation, when it is detected that the user is talking. Alternately, an adaptive algorithm may be disabled until speech enhancement is required, and then only updates the filter coefficients when it is detected that the user is not talking. Some examples of systems that detect whether the user is talking are described in co-pending U.S. patent application Ser. No. 15/463,259, titled SYSTEMS AND METHODS OF DETECTING SPEECH ACTIVITY OF HEADPHONE USER, filed on Mar. 20, 2017, and hereby incorporated by reference in its entirety.

In certain examples, the weights and/or coefficients applied by the adaptive filter may be established or updated by a parallel or background process. For example, an additional adaptive filter may operate in parallel to the adaptive filter 314 and continuously update its coefficients in the background, i.e., not affecting the active signal processing shown in the example system 300 of FIG. 3, until such time as the additional adaptive filter provides a better voice estimate signal. The additional adaptive filter may be referred to as a background or parallel adaptive filter, and when the parallel adaptive filter provides a better voice estimate, the weights and/or coefficients used in the parallel adaptive filter may be copied over to the active adaptive filter, e.g., the adaptive filter 314.

In certain examples, a reference signal such as the reference signal 312 may be derived by other methods or by other components than those discussed above. For example, the reference signal may be derived from one or more separate microphones with reduced responsiveness to the user's voice, such as a rear-facing microphone, e.g., the rear microphone 206. Alternately the reference signal may be derived from the set of microphones 302 using beam forming techniques to direct a broad beam away from the user's mouth, or may be combined without array or beam forming techniques to be responsive to the acoustic environment generally without regard for user voice components included therein.

The example system 300 may be advantageously applied to a headphone system, e.g., the headphones 100, to pick-up a user's voice in a manner that enhances the user's voice and reduces background noise. For example, and as discussed in greater detail below, signals from the microphones 202 (FIG. 2) may be processed by the example system 300 to provide a voice estimate signal 316 having a voice component enhanced with respect to background noise, the voice component representing speech from the user, i.e., the wearer of the headphones 100. As discussed above, in certain examples, the array processor 306 is a super-directive near-field beam former that enhances acoustic response in the direction of the user's mouth, and the array processor 308 is a delay-and-sum algorithm that steers a null, i.e., reduces acoustic response, in the direction of the user's mouth. The example system 300 illustrates a system and method for monaural speech enhancement from one array of microphones 302. Discussed in greater detail below are variations to the system 300 that include, at least, binaural processing of two arrays of microphones (e.g., right and left arrays), further speech enhancement by spectral processing, and separate processing of signals by sub-bands.

Figure 4:
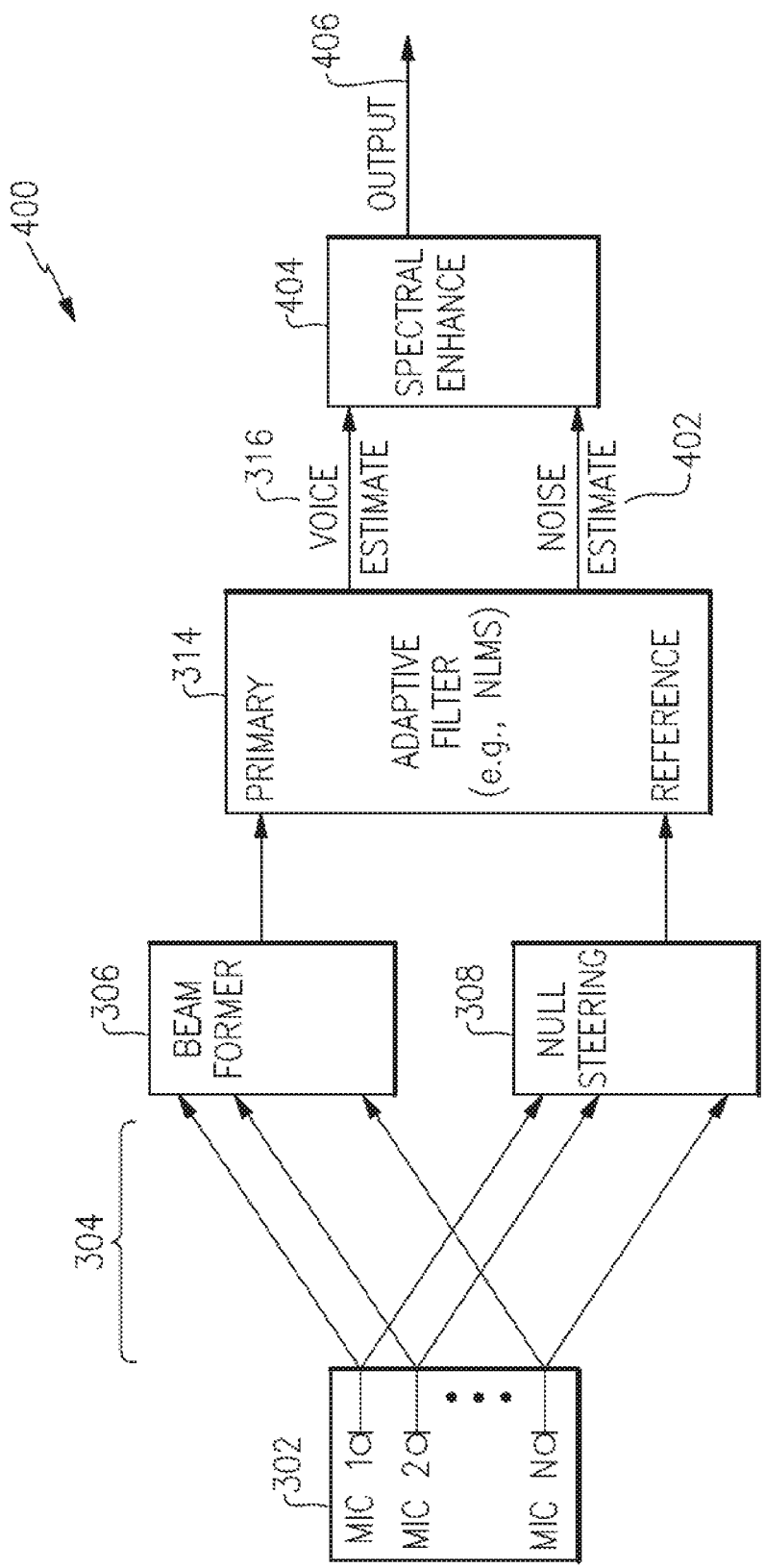
FIG. 4 is a schematic diagram of another example system to enhance a user's voice.

FIG. 4 is a block diagram of a further example of a signal processing system 400 to produce an output signal that includes a user's voice component enhanced with respect to background noise and other talkers. FIG. 4 is similar to FIG. 3, but further includes a spectral enhancement operation 404 performed at the output of the adaptive filter 314.

As discussed above, an example adaptive filter 314 may generate a noise estimate, e.g., noise estimate signal 402. As shown in FIG. 4, the voice estimate signal 316 and the noise estimate signal 402 may be provided to, and received by, a spectral enhancer 404 that enhances the short-time spectral amplitude (STSA) of the speech, thereby further reducing noise in an output signal 406. Examples of spectral enhancement that may be implemented in the spectral enhancer 404 include spectral subtraction techniques, minimum mean square error techniques, and Wiener filter techniques. While the adaptive filter 314 reduces the noise component in the voice estimate signal 316, spectral enhancement via the spectral enhancer 404 may further improve the voice-to-noise ratio of the output signal 406. For example, the adaptive filter 314 may perform better with fewer noise sources, or when the noise is stationary, e.g., the noise characteristics are substantially constant. Spectral enhancement may further improve system performance when there are more noise sources or changing noise characteristics. Because the adaptive filter 314 generates a noise estimate signal 402 as well as a voice estimate signal 316, the spectral enhancer 404 may operate on the two estimate signals, using their spectral content to further enhance the user's voice component of the output signal 406.

As discussed above, the example systems 300, 400 may operate in a digital domain and may include analog-to-digital converters (not shown). Additionally, components and processes included in the example systems 300, 400 may achieve better performance when operating upon narrow-band signals instead of wideband signals. Accordingly, certain examples may include sub-band filtering to allow processing of one or more sub-bands by the example systems 300, 400. For example, beam forming, null steering, adaptive filtering, and spectral enhancement may exhibit enhanced functionality when operating upon individual sub-bands. The sub-bands may be synthesized together after operation of the example systems 300, 400 to produce a single output signal. In certain examples, the signals 304 may be filtered to remove content outside the typical spectrum of human speech. Alternately or additionally, the example systems 300, 400 may be employed to operate on sub-bands. Such sub-bands may be within a spectrum associated with human speech. Additionally or alternately, the example systems 300, 400 may be configured to ignore sub-bands outside the spectrum associated with human speech. Additionally, while the example systems 300, 400 are discussed above with reference to only a single set of microphones 302, in certain examples there may be additional sets of microphones, for example a set on the left side and another set on the right side, to which further aspects and examples of the example systems 300, 400 may be applied, and combined, to provide improved voice enhancement, at least one example of which is discussed in more detail with reference to FIG. 5.

Figure 5:
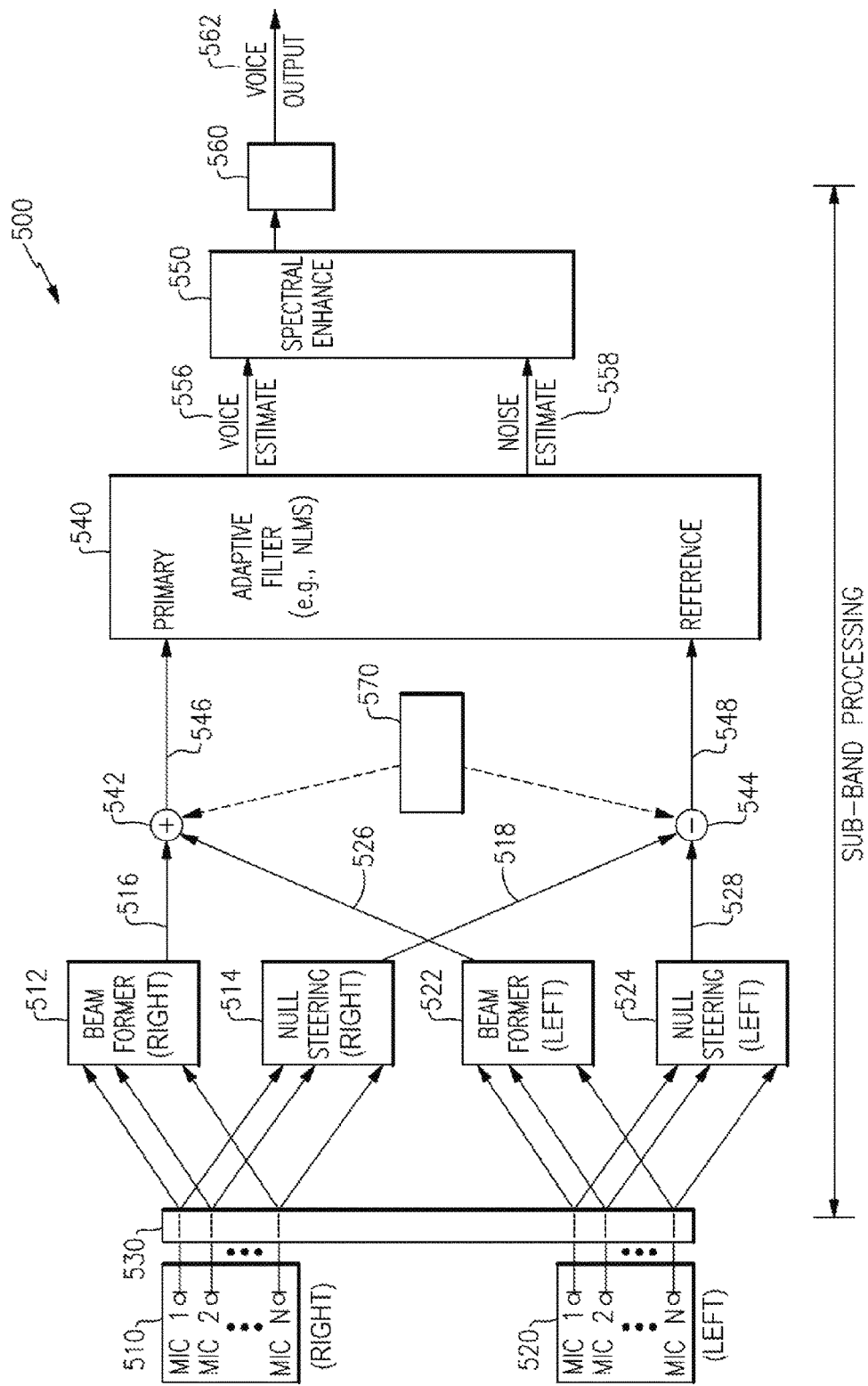
FIG. 5 is a schematic diagram of another example system to enhance a user's voice.

FIG. 5 is a block diagram of an example signal processing system 500 including a right microphone array 510, a left microphone array 520, a sub-band filter 530, a right beam processor 512, a right null processor 514, a left beam processor 522, a left null processor 524, an adaptive filter 540, a combiner 542, a combiner 544, a spectral enhancer 550, a sub-band synthesizer 560, and a weighting calculator 570. The right microphone array 510 includes multiple microphones on the user's right side, e.g., coupled to a right earcup 102 on a set of headphones 100 (see FIGS. 1-2), responsive to acoustic signals on the user's right side. The left microphone array 520 includes multiple microphones on the user's left side, e.g., coupled to a left earcup 104 on a set of headphones 100 (see FIGS. 1-2), responsive to acoustic signals on the user's left side. Each of the right and left microphone arrays 510, 520 may include a single pair of microphones, comparable to the pair of microphones 202 shown in FIG. 2. In other examples, more than two microphones may be provided and used on each earpiece.

In the example shown in FIG. 5, each microphone to be used for speech enhancement in accordance with aspects and examples disclosed herein provides a signal to the sub-band filter 530, which separates spectral components of each microphone into multiple sub-bands. Signals from each microphone may be processed in analog form but preferably are converted to digital form by one or more ADC's associated with each microphone, or associated with the sub-band filter 530, or otherwise acting on each microphone's output signal between the microphone and the sub-band filter 530, or elsewhere. Accordingly, in certain examples the sub-band filter 530 is a digital filter acting upon digital signals derived from each of the microphones. Any of the ADC's, the sub-band filter 530, and other components of the example system 500 may be implemented in a digital signal processor (DSP) by configuring and/or programming the DSP to perform the functions of, or act as, any of the components shown or discussed.

The right beam processor 512 is a beam former that acts upon signals from the right microphone array 510 in a manner to form an acoustically responsive beam directed toward the user's mouth, e.g., below and in front of the user's right ear, to provide a right primary signal 516, so-called because it includes an increased user voice component due to the beam directed at the user's mouth. The right null processor 514 acts upon signals from the right microphone array 510 in a manner to form an acoustically unresponsive null directed toward the user's mouth to provide a right reference signal 518, so-called because it includes a reduced user voice component due to the null directed at the user's mouth. Similarly, the left beam processor 522 provides a left primary signal 526 from the left microphone array 520, and the left null processor 524 provides a left reference signal from the left microphone array 520. The right primary and reference signals 516, 518 are comparable to the primary and reference signals discussed above with respect to the example systems 300, 400 of FIGS. 3-4. Likewise, the left primary and reference signals 526, 528 are comparable to the primary and reference signals discussed above with respect to the example systems 300, 400 of FIGS. 3-4.

The example system 500 processes the binaural set, right and left, of primary and reference signals, which may improve performance over the monaural example systems 300, 400. As discussed in greater detail below, the weighting calculator 570 may influence how much of each of the left or right primary and reference signals are provided to the adaptive filter 540, even to the extent of providing only one of the left or right set of signals, in which case the operation of system 500 is reduced to a monaural case, similar to the example systems 300, 400.

The combiner 542 combines the binaural primary signals, i.e., the right primary signal 516 and the left primary signal 526, for example by adding them together, to provide a combined primary signal 546. Each of the right primary signal 516 and the left primary signal 526 has a comparable voice component indicative of the user's voice when the user is speaking, at least because the right and left microphone arrays 510, 520 are approximately symmetric and equidistant relative to the user's mouth. Due to this physical symmetry, acoustic signals from the user's mouth arrive at each of the right and left microphone arrays 510, 520 with substantially equal energy at substantially the same time and with substantially the same phase. Accordingly, the user's voice component within the right and left primary signals 516, 526 may be substantially symmetric to each other and reinforce each other in the combined primary signal 546. Various other acoustic signals, e.g., background noise and other talkers, tend not to be right-left symmetric about the user's head and do not reinforce each other in the combined primary signal 546. To be clear, noise components within the right and left primary signals 516, 526 carry through to the combined primary signal 546, but do not reinforce each other in the manner that the user's voice components may. Accordingly, the user's voice components may be more substantial in the combined primary signal 546 than in either of the right and left primary signals 516, 526 individually. Additionally, weighting applied by the weighting calculator 570 may influence whether noise and voice components within each of the right and left primary signals 516, 526 are more or less represented in the combined primary signal 546. The combiner 544 combines the right reference signal 518 and the left reference signal 528 to provide a combined reference signal 548. In examples, the combiner 544 may take a difference between the right reference signal 518 and the left reference signal 528, e.g., by subtracting one from the other, to provide the combined reference signal 548. Due to the null steering action of the right and left null processors 514, 524, there is minimal, if any, user voice component in each of the right and left reference signals 518, 528. Accordingly there is minimal, if any, user voice component in the combined reference signal 548. For examples in which the combiner 544 is a subtractor, whatever user voice component exists in each of the right and left reference signals 518, 528 is reduced by the subtraction due to the relative symmetry of the user's voice components, as discussed above. Accordingly, the combined reference signal 548 has sub-stantially no user voice component and is instead comprised substantially entirely of noise, e.g., background noise, other talkers. As above, weighting applied by the weighting calculator 570 may influence whether the left or right noise components are more or less represented in the combined reference signal 548.

The adaptive filter 540 is comparable to the adaptive filter 314 of FIGS. 3-4. The adaptive filter 540 receives the combined primary signal 546 and the combined reference signal 548 and applies a digital filter, with adaptive coefficients, to provide a voice estimate signal 556 and a noise estimate signal 558. As discussed above, the adaptive coefficients may be established during an enforced pause, may be frozen whenever the user is speaking, may be adaptively updated whenever the user is not speaking, or may be updated at intervals by a background or parallel process, or may be established or updated by any combination of these.

Also as discussed above, the reference signal, e.g., the combined reference signal 548, is not necessarily equal to the noise component(s) present in the primary signal, e.g., the combined primary signal 546, but is substantially correlated to the noise component(s) in the primary signal. The operation of the adaptive filter 540 is to adapt or "learn" the best digital filter coefficients to convert the reference signal into a noise estimate signal that is substantially similar to the noise component(s) in the primary signal. The adaptive filter 540 then subtracts the noise estimate signal from the primary signal to provide a voice estimate signal. In the example system 500, the primary signal received by the adaptive filter 540 is the combined primary signal 546 derived from the right and left beam formed primary signals (516, 526) and the reference signal received by the adaptive filter 540 is the combined reference signal 548 derived from the right and left null steered reference signals (518, 528). The adaptive filter 540 processes the combined primary signal 546 and the combined reference signal 548 to provide the voice estimate signal 556 and the noise estimate signal 558.

As discussed above, the adaptive filter 540 may generate a better voice estimate signal 556 when there are fewer and/or stationary noise sources. The noise estimate signal 558, however, may substantially represent the spectral content of the environmental noise even if there are more or changing noise sources, and further improvement of the system 500 may be had by spectral enhancement. Accordingly, the example system 500 shown in FIG. 5 provides the voice estimate signal 556 and the noise estimate signal 558 to the spectral enhancer 550, in the same fashion as discussed in greater detail above with respect to the example system 400 of FIG. 4, which may provide improved voice enhancement.

As discussed above, in the example system 500, the signals from the microphones are separated into sub-bands by the sub-band filter 530. Each of the subsequent components of the example system 500 illustrated in FIG. 5 logically represents multiple such components to process the multiple sub-bands. For example, the sub-band filter 530 may process the microphone signals to provide frequencies limited to a particular range, and within that range may provide multiple sub-bands that in combination encompass the full range. In one particular example, the sub-band filter may provide sixty-four sub-bands covering 125 Hz each across a frequency range of 0 to 8,000 Hz. An analog to digital sampling rate may be selected for the highest frequency of interest, for example a 16 kHz sampling rate satisfies the Nyquist-Shannon sampling theorem for a frequency range up to 8 kHz.

Accordingly, to illustrate that each component of the example system 500 illustrated in FIG. 5 represents multiple such components, it is considered that in a particular example the sub-band filter 530 may provide sixty-four sub-bands covering 125 Hz each, and that two of these sub-bands may include a first sub-band, e.g., for the frequencies 1,500 Hz-1,625 Hz, and a second sub-band, e.g., for the frequencies 1,625 Hz-1,750 Hz. A first right beam processor 512 will act on the first sub-band, and a second right beam processor 512 will act on the second sub-band. A first right null processor 514 will act on the first sub-band, and a second right null processor 514 will act on the second sub-band. The same may be said of all the components illustrated in FIG. 5 from the output of the sub-band filter 530 through to the input of the sub-band synthesizer 560, which acts to re-combine all the sub-bands into a single voice output signal 562. Accordingly, in at least one example, there are sixty-four each of the right beam processor 512, right null processor 514, left beam processor 522, left null processor 524, adaptive filter 540, combiner 542, combiner 544, and spectral enhancer 550. Other examples may include more or fewer sub-bands, or may not operate upon sub-bands, for example by not including the sub-band filter 530 and the sub-band synthesizer 560. Any sampling frequency, frequency range, and number of sub-bands may be implemented to accommodate varying system requirements, operational parameters, and applications. Additionally, multiples of each component may nonetheless be implemented in, or performed by, a single digital signal processor or other circuitry, or a combination of one or more digital signal processors and/or other circuitry.

The weighting calculator 570 may advantageously improve performance of the example system 500, or may be omitted altogether in various examples. The weighting calculator 570 may control how much of the left or right signals are factored into the combined primary signal 546 or the combined reference signal 548, or both. The weighting calculator 570 establishes factors applied by the combiner 542 and the combiner 544. For instance, the combiner 542 may by default add the right primary signal 516 directly to the left primary signal 526, i.e., with equal weighting. Alternatively, the combiner 542 may provide the combined primary signal 546 as a combination formed from a smaller portion of the right primary signal 516 and a larger portion from the left primary signal 526, or vice versa. For example, the combiner 542 may provide the combined primary signal 546 as a combination such that 40% is formed from the right primary signal 516 and 60% from the left primary signal 526, or any other suitable unequal combination. The weighting calculator 570 may monitor and analyze any of the microphone signals, such as one or more of the right microphones 510 and the left microphones 520, or may monitor and analyze any of the primary or reference signals, such as the right primary signal 516 and left primary signal 526 and/or the right reference signal 518 and left reference signal 528, to determine an appropriate weighting for either or both of the combiners 542, 544.

In certain examples, the weighting calculator 570 analyzes the total signal amplitude, or energy, of any of the right and left signals and more heavily weights whichever side has the lower total amplitude or energy. For example, if one side has substantially higher amplitude, such may indicate the presence of wind or other sources of noise affecting that side's microphone array. Accordingly, reducing the weight of that side's primary signal into the combined primary signal 546 effectively reduces the noise, e.g., increases the voice-to-noise ratio, in the combined primary signal 546, and may improve the performance of the system. In similar fashion, the weighting calculator 570 may apply a similar weighting to the combiner 544 so one of the right or left side reference signals 518, 528 more heavily influences the combined reference signal 548.

The voice output signal 562 may be provided to various other components, devices, features, or functions. For example, in at least one example the voice output signal 562 is provided to a virtual personal assistant for further processing, including voice recognition and/or speech-to-text processing, which may further be provided for internet searching, calendar management, personal communications, etc. The voice output signal 562 may be provided for direct communications purposes, such as a telephone call or radio transmission. In certain examples, the voice output signal 562 may be provided in digital form. In other examples, the voice output signal 562 may be provided in analog form. In certain examples, the voice output signal 562 may be provided wirelessly to another device, such as a smartphone or tablet. Wireless connections may be by Bluetooth® or near field communications (NFC) standards or other wireless protocols sufficient to transfer voice data in various forms. In certain examples, the voice output signal 562 may be conveyed by wired connections. Aspects and examples disclosed herein may be advantageously applied to provide a speech enhanced voice output signal from a user wearing a headset, headphones, earphones, etc. in an environment that may have additional acoustic sources such as other talkers, machinery and equipment, aviation and aircraft noise, or any other background noise sources.

In the example systems 300, 400, 500 discussed above, and in further example systems discussed below, primary signals are provided with enhanced user voice components in part by using beam forming techniques. In certain examples, the beam former(s) (e.g., array processors 306, 512, 522) use super-directive near-field beam forming to steer a beam toward a user's mouth in a headphone application. The headphone environment is challenging in part because there is typically not much room to have numerous microphones on a headphone form factor. Conventional wisdom holds that to effectively isolate other sources, e.g., noise sources, with beam forming techniques requires, or works best, when the number of microphones is one more than the number of noise sources. The headphone form factor, however, fails to allow room for enough microphones to satisfy this conventional condition in noisy environments, which typically include numerous noise sources. Accordingly, certain examples of the beam formers discussed in the example systems herein implement super-directive techniques and take advantage of near-field aspects of the user's voice, e.g., that the direct path of a user's speech is a dominant component of the signals received by the (relatively few, e.g., two in some cases) microphones due to the proximity of the user's mouth, as opposed to noise sources that tend to be farther away and not dominant. Also as discussed above, certain examples include a delay-and-sum implementation of the various null steering components (e.g., array processors 308, 514, 524). Further, conventional systems in a headphone application fail to provide adequate results in the presence of wind noise. Certain examples herein incorporate binaural weighting (e.g., by the weighting calculator 570 acting upon combiners 542, 544) to vary weighting between sides, when necessary, which may be in part to accommodate and compensate for wind conditions. Accordingly, certain aspects and examples provided herein provide enhanced performance in a headphone/headset application by using one or more of super-directive near-field beam forming, delay-and-sum null steering, binaural weighting factors, or any combination of these.

Figure 6:
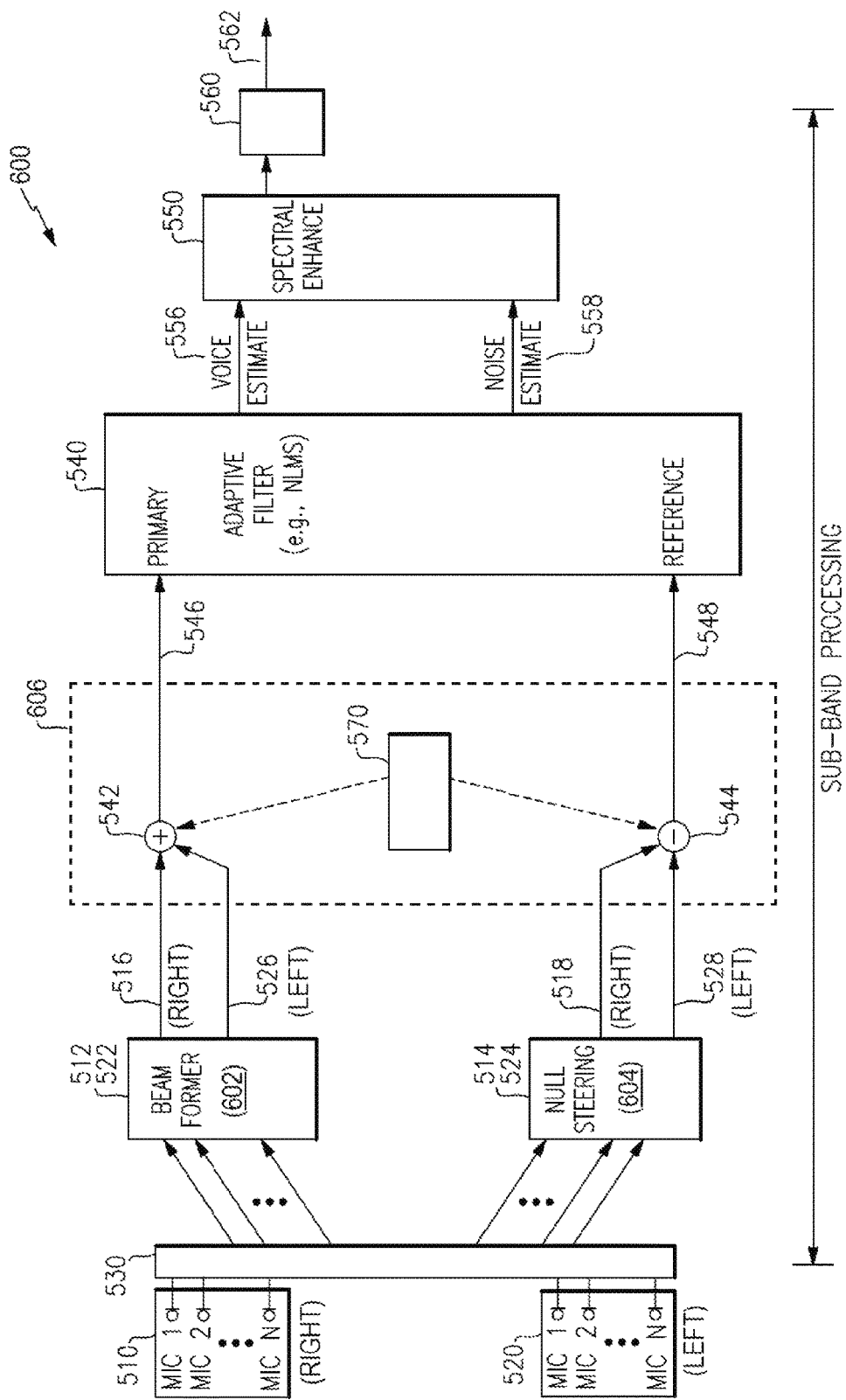
FIG. 6 is a schematic diagram of another example system to enhance a user's voice.

FIG. 6 illustrates a further example system 600 that is substantially equivalent to the system 500 of FIG. 5. In FIG. 6, the right beam processor 512 and the left beam processor 522 are illustrated as a single block, e.g., a beam processor 602. Similarly, the right null processor 514 and the left null processor 524 are illustrated as a single block, e.g., a null processor 604. The variation in illustration is for convenience and simplicity in the figures, including the figures that follow. Functionality of the beam processor 602 to produce right and left primary signals 516, 526 may be substantially the same as discussed previously. Likewise, functionality of the null processor 604 to produce right and left reference signals 518, 528 may be substantially the same as discussed previously. FIG. 6 further illustrates the cooperative nature of the weighting calculator 570 with the combiners 542, 544, which together form a mixer 606. Functionality of the mixer 606 may be substantially the same as previously described with respect to its components, e.g., the weighting calculator 570 and the combiners 542, 544.

Figure 7A:
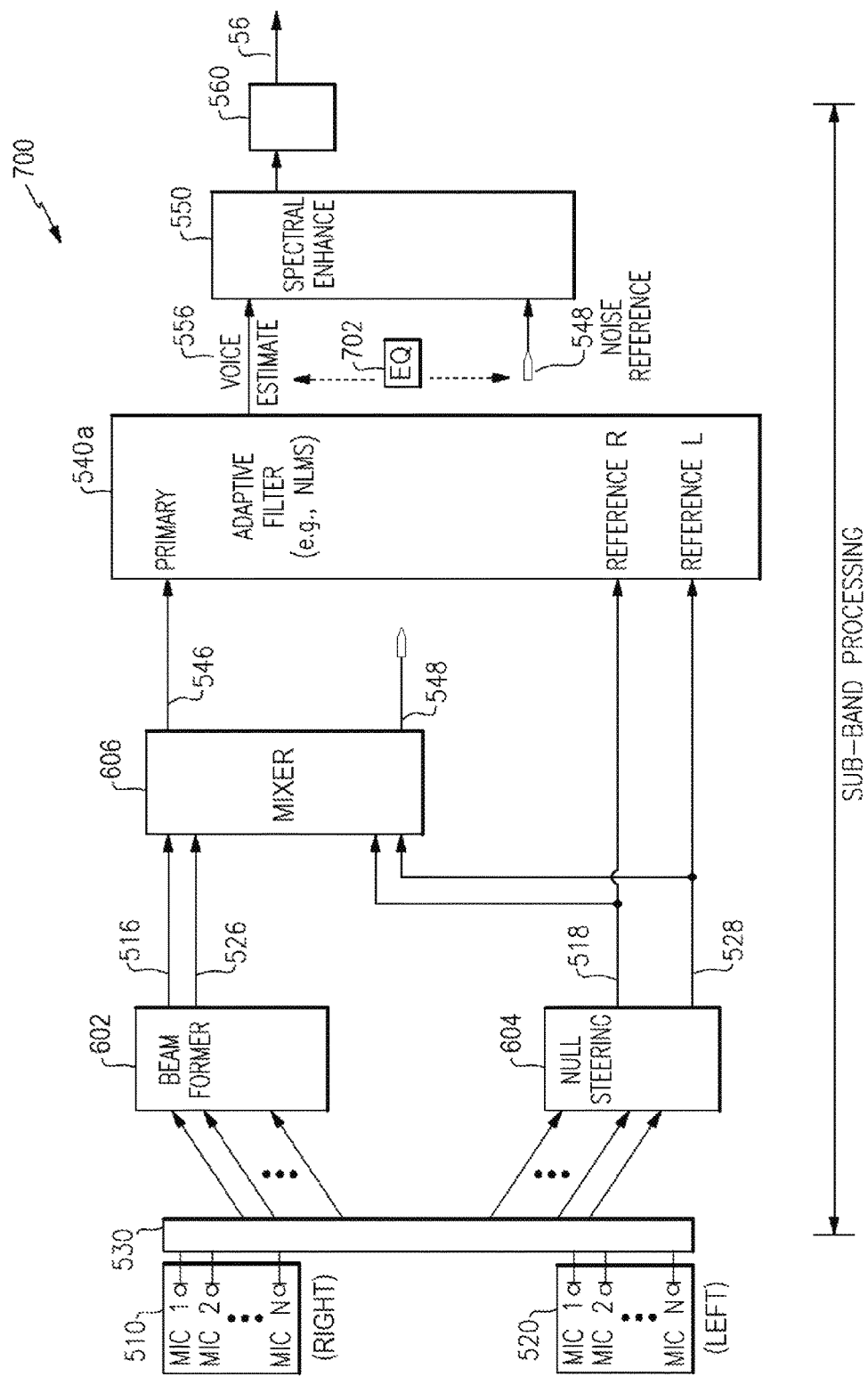
FIG. 7A is a schematic diagram of another example system to enhance a user's voice.

FIG. 7A illustrates a further example system 700, substantially similar to the systems 500, 600, having an adaptive filter 540a that accommodates multiple reference signal inputs, e.g., a right reference input and a left reference input. The right and left reference signals 518, 528 primarily represent the acoustic environment not including the user's voice, e.g., the signals have reduced or suppressed user voice components as previously described, but in some examples the right and left acoustic environment may be significantly different, such as in the case of wind or other sources that may be stronger on one side or the other. Accordingly, the adaptive filter 540a may accommodate the two reference signals (e.g., right and left reference signals 518, 528) distinctly, without mixing, to enhance noise reduction performance, in some examples.

In some examples, the multi-reference adaptive filter 540a may provide a noise estimate (e.g., comparable to the noise estimate signal 558) to the spectral enhancer 550 as previously described. In other examples, the spectral enhancer 550 may receive a combined reference signal 548 (e.g., a noise reference signal) from the mixer 606, as shown in FIG. 7A. In other examples, a noise estimate may be provided to the spectral enhancer 550 in various other ways, which may include various combinations of the right and left reference signals 518, 528, the combined reference signal 548, a noise estimate signal provided by the adaptive filter 540a, and/or other signals.

Also shown in FIG. 7A is an equalization block 702 that may be included in various examples, such as when a noise reference signal (as shown), rather than a noise estimate signal, is provided to the spectral enhancer 550. The equalization block 702 is configured to equalize the voice estimate signal 556 with the combined reference signal 548. As discussed above, the voice estimate signal 556 may be provided by the adaptive filter 540a from a combined primary signal 546, which may be influenced by various array processing techniques (e.g., A or B beam forming in FIG. 10, which may be MVDR or delay-and-sum processing in some examples), and the combined reference signal 548 may come from the mixer 606, such that the voice estimate and noise reference signals received by the spectral enhancer 550 may have differing frequency responses and/or differing gains applied in different sub-bands. In certain examples, settings (e.g., coefficients) of the equalization block 702 may be calculated (selected, adapted, etc.) when the user is not speaking.

For example, when a user is not speaking, each of the voice estimate signal 556 and the combined reference signal 548 may represent substantially equivalent acoustic content (e.g., of the surroundings), but having differing frequency responses due to differing processing, such that equalization settings calculated during this time (of no user speech) may improve operation of the spectral enhancer 550. Accordingly, settings of the equalization block 702 may be calculated when a voice activity detector indicates that the headphone user is not speaking (e.g., VAD=0), in some examples. When the user begins talking (e.g., VAD=1), settings of the equalization block 702 may be frozen, and whatever equalization settings were calculated up until that time are used while the user speaks. In some examples, the equalization block 702 may incorporate outlier rejection, e.g., throwing out data that seems unusual, and may enforce one or more maximum or minimum equalization levels, to avoid erroneous equalization and/or to avoid applying excessive equalization.

Figure 7B:
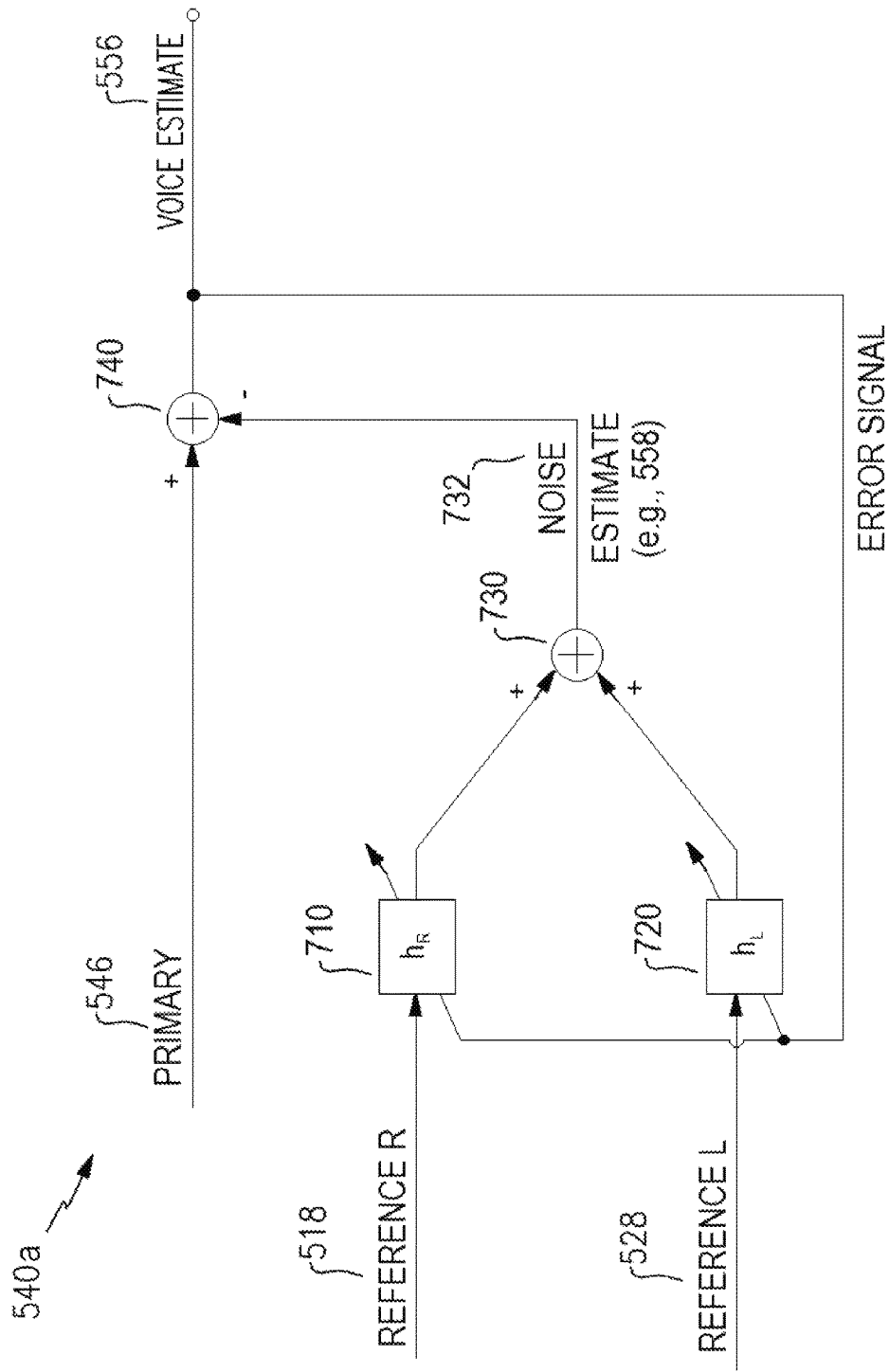
FIG. 7B is a schematic diagram of an example adaptive filter system suitable for use with the system of FIG. 7A.

At least one example of an adaptive filter 540a to accommodate multiple reference inputs is shown in FIG. 7B. The right and left reference signals 518, 528 may be filtered by right and left filters 710, 720, respectively, whose outputs are combined by a combiner 730 to provide a noise estimate signal 732. The noise estimate signal 732 (comparable to the noise estimate signal 558 described previously) is subtracted from the combined primary signal 546 to provide the voice estimate signal 556. The voice estimate signal 556 may be provided as an error signal to one or more adaptive algorithm(s) (e.g., NLMS) to update filter coefficients of the right and left filters 710, 720.

In various examples, a voice activity detector (VAD) may provide a flag to indicate when the user is talking, and the adaptive filter 540a may receive the VAD flag, and in some examples the adaptive filter 540a may pause or freeze adaptation (e.g., of the filters 710, 720) when the user is talking and/or soon after the user begins talking.

In various examples, a far end voice activity detector may be provided and may provide a flag to indicate when a remote person is talking (e.g., a conversation partner), and the adaptive filter 540a may receive the flag, and in some examples the adaptive filter 540a may pause or freeze adaptation (e.g., of the filters 710, 720) when the remote person is talking and/or soon after he/she begins talking.

In some examples, one or more delays may be included in one or more signal paths. In certain examples, such delays may accommodate a time delay for a VAD to detect user voice activity, e.g., so that a pause in adaptation occurs prior to processing a signal portion that includes the user voice component(s). In certain examples, such delays may align various signals to accommodate a difference in processing between two signals. For example, the combined primary signal 546 is received by the adaptive filter 540a after processing by the mixer 606, while the right and left reference signals 518, 528 are received by the adaptive filter 540a from the null processor 604. Accordingly, a delay may be included in any or all of the signals 546, 518, 528, before reaching the adaptive filter 540a such that the signals 546, 518, 528 are each processed by the adaptive filter 540a at an appropriate time (e.g., aligned). In various examples, wind detection capability may be provided (an example of which is discussed in further detail below) and may provide one or more flags (e.g., indicator signals) to the adaptive filter 540a (and/or the mixer 606), which may respond to the indication of wind by, e.g., weighting the left or right side more heavily, switching to monaural operation, and/or freezing adaptation of a filter.

In some acoustic environments, various forms of enhancing acoustic response from certain directions may perform better than other forms. Accordingly, one or more forms of beam former 602 may be better suited in certain environments and/or under certain conditions than another form. For example, during windy conditions, a delay-and-sum approach may provide better enhancement of user voice components than super-directive near-field beam forming. Accordingly, in some examples, various forms of beam processor 602 may be provided and various beam forming output signals may be analyzed, selected among, and/or mixed in various examples.

Regarding terminology, "delay-and-sum" refers generally to any form of aligning signals in time and combining the signals, whether to enhance or reduce a signal component. Aligning the signals may mean, for example, delaying one or more signals to accommodate a difference in distance of the microphone from the acoustic source, to align the microphone signals as if the acoustic signal had reached each of the microphones at the same time, to accommodate different propagation delay from the acoustic source to each microphone, etc. Combining the aligned signals may include adding them to enhance aligned components and/or may include subtracting them to suppress or reduce aligned components. Accordingly, delay-and-sum may be used to enhance or reduce response in various examples, and therefore may be used for beam steering or null steering, e.g., in relation to the beam processor 602 and the null processor 604 as described herein. When aligned signal components are reduced (e.g., null steering to reduce user voice components), the terminology of "delay-and-subtract" may be used in some examples.

Figure 8A:
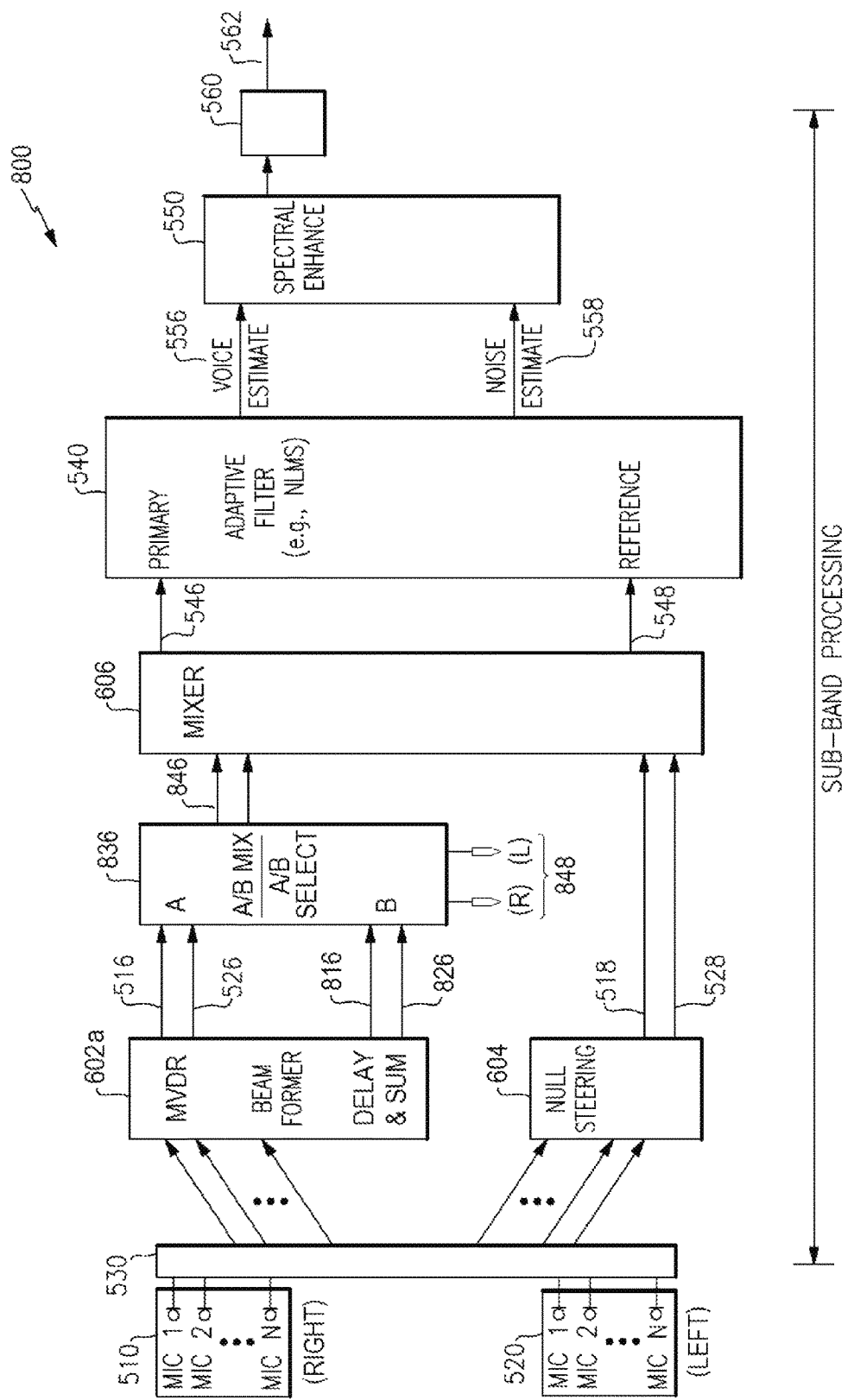
FIG. 8A is a schematic diagram of another example system to enhance a user's voice.

FIG. 8A illustrates a further example system 800, similar to the system 600 of FIG. 6, that includes a beam processor 602a that provides multiple beam formed outputs to a selector 836. For example, the beam former 602a may provide right and left primary signals 516, 526, as previously discussed, using a certain form of array processing, such as minimum variance distortionless response (MVDR), and may also provide right and left secondary signals 816, 826 via a different form of array processing, such as delay-and-sum. Each of the right and left primary signals 516, 526 and secondary signals 816, 826 may include an enhanced voice component, but in various acoustic environments and/or use cases, the primary signals 516, 526 may provide a higher quality voice component and/or voice-to-noise ratio than the secondary signals 816, 826, while in other acoustic environments the secondary signals 816, 826 may provide a higher quality voice component and/or voice-to-noise ratio.

In windy conditions, an MVDR response signal may become saturated (e.g., high magnitude) while a delay-and-sum response signal may be more accommodating of the wind condition. In lower winds, a delay-and-sum response signal may be higher in magnitude than an MVDR response signal. Accordingly, in some examples, a comparison of signal magnitudes (or signal energy levels) may be made between two signals provided via differing forms of array processing to determine whether a windy condition exists and/or to determine which signal may have a preferred voice component for further processing.

With continued reference to FIG. 8A, one or more of the primary signals 516, 526 (formed from a first array technique, e.g., MVDR) may be compared to one or other of the secondary signals 816, 826 (formed from a second array technique, e.g., delay-and-sum) by a selector 836, which may determine which of the primary or secondary signals (or a blend or mix of the primary or secondary signals) to provide to the mixer 606, and may determine whether a wind condition exists on either or both of the right or left sides, and may provide wind flags 848 to indicate the determination of a wind condition. The right and left signals provided to the mixer 606 by the selector 836 are collectively identified by the reference numeral 846 in FIG. 8A.

Further details of at least one example of a selector 836 are illustrated with reference to FIG. 8B. With reference to the right side signals, the right primary signal 516 (formed from the right microphone array 510 by a first array processing technique) may be compared by a comparison block 840R to the right secondary signal 816 to determine which has a higher signal energy (and/or magnitude). In some examples, signal energy comparison may be performed by the comparison block 840R to detect a windy condition. For example, if the primary signal 516 is provided by an MVDR technique and the secondary signal 816 is provided by a delay-and-sum technique, in some instances, the primary signal 516 may have a relatively high signal level as compared to the secondary signal 816 when a wind level exceeds some threshold. Accordingly, signal energy in the primary signal 516 ($E_{MVDR}$) may be compared with signal energy in the secondary signal 816 ($E_P$) (in some examples, a delay-and-sum technique may provide a signal considered similar to a pressure microphone signal). If the energy of the primary signal 516 exceeds a threshold value of the energy of the secondary signal 816 (e.g., $E_{MVDR} > Th \times E_P$, where Th is a threshold factor), the comparison block 840R may indicate a windy condition on the right side and may provide a wind flag 848R to other components of the system. In some examples, the relative comparison of signal energies may indicate how strong a wind condition exists, e.g., the comparison block 840R may, in some cases, apply multiple threshold to detect no wind, light wind, average wind, high wind, etc. In various examples, the comparison block 840R also controls which of the primary or secondary signals 516, 816, or a mix of the two, is provided as the output signal 846R to the mixer 606 for further processing. Accordingly, the comparison block 840R may determine a weighting factor, α, which impacts a combiner 844R as to how much of the primary signal 516 and the secondary signal 816 may be combined to provide the output signal 846R. For example, when the energy of the primary signal 516 is low relative to the secondary signal, such may indicate that wind is not present (or is relatively light), and in some examples the array processing from which the primary signal 516 is formed may be considered to have better performance in non-windy conditions, and accordingly the weighting factor may be set to unity, α=1, to cause the combiner 844R to provide the primary signal 516 as the output signal 846R and to reject the secondary signal 816. When a windy condition is detected, and in some examples when a high wind condition is detected, the weighting factor may be set to zero, α=0, to cause the combiner 844R to provide the secondary signal 816 as the output signal 846R and to reject the primary signal 516.

In some examples, one or more additional thresholds may be applied by the comparison block 840R and may set the weighting factor, a, to some intermediate value between zero or unity, $0 \leq \alpha \leq 1$. In some examples, a time constant or other smoothing operation may be applied by the comparison block 840R to prevent repeated toggling of system parameters (e.g., wind flag 848R, weighting factor, a) when a signal energy is near a threshold (e.g., varying above and below the threshold). In some examples, when a signal energy surpasses a threshold, the comparison block 840R may gradually adjust the weighting factor, a, over a period of time to ultimately arrive at a new value, thus preventing a sudden change in the output signal 846R. In some examples, mixing by the combiner 844R may be controlled by other mixing parameters. In some examples, the selector 836 may provide right and left output signals 846 of higher magnitude (e.g., amplified) than the respective primary and secondary signals received.

As discussed in greater detail above, processing in any of the systems described may be separated by sub-bands. Accordingly, in various examples, the selector 836 may process the primary and secondary signals by sub-band. In some examples, the comparison block 840R may compare the primary signal 516 to the secondary signal 816 within a subset of the sub-bands. For example, a windy condition may more significantly impact certain sub-bands, or a range of sub-bands (e.g., particularly at lower frequencies), and the comparison block 840R may compare signal energies in those sub-bands and not others.

Further, different array processing techniques may have different frequency responses that may be reflected in the primary signal 516 relative to the secondary signal 816. Accordingly, some examples may apply equalization to either (or both) of the primary signal 516 and/or the secondary signal 816 to equalize these signals relative to each other, as illustrated in FIG. 8B by a EQ 842R.

In certain examples, various threshold factors (potentially separated by sub-band) as discussed above may operate in unison with equalization parameters to establish the conditions under which wind may be indicated and under which mixing parameters may be selected and applied. Accordingly, a wide range of operating flexibility may be achieved with the selector 836, and various selection and/or programming of such parameters may allow designers to accommodate a wide range of operating conditions and/or to accommodate varying system criteria and/or applications.

Figure 8B:
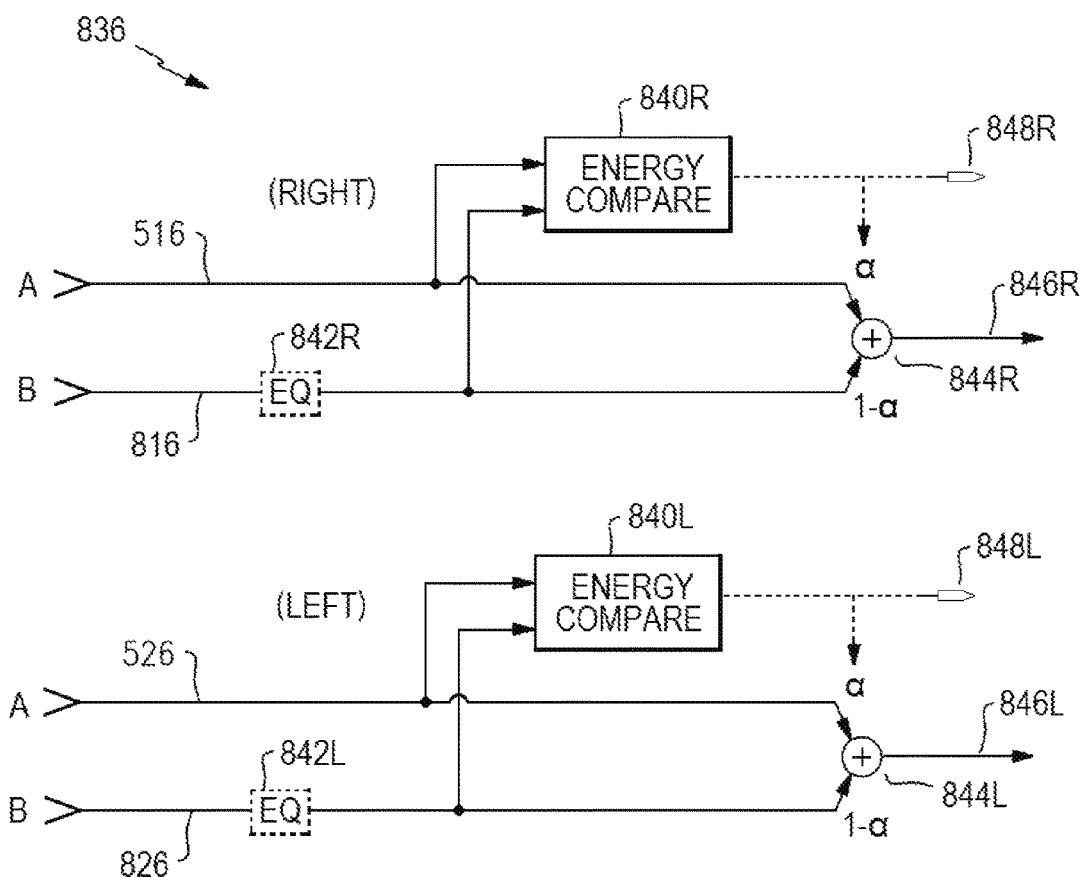
FIG. 8B is a schematic diagram of an example mixer system suitable for use with the system of FIG. 8A.

With continued reference to FIG. 8B, the various components and description with respect to right side signals as discussed above may equally apply to a set of components for processing left side signals, as shown. Accordingly, in various examples, the selector 836 may provide a right output signal 846R and a left output signal 846L. In some examples, the comparison blocks 840 may cooperatively operate to apply a single weighting factor, a, or other mixing parameter, on both the right and left sides. In other examples, the right and left output signals 846 may include different mixes, potentially within some limit, of their respective primary and secondary signals.

In certain examples, a wind condition detected to be more prevalent on one side or the other may be configured to switch the entire system into a monaural mode, e.g., to process signals on the less windy side for the provision of the voice output signal 562.

As discussed previously, the wind flags 848 may be provided to and used by the adaptive filter 540 (or 540a), which may freeze adaptation in response to a wind condition, for example. Additionally, the wind flags 848 may be provided to a voice activity detector, which may alter VAD processing in response to a wind condition, in some examples.

Figure 9:
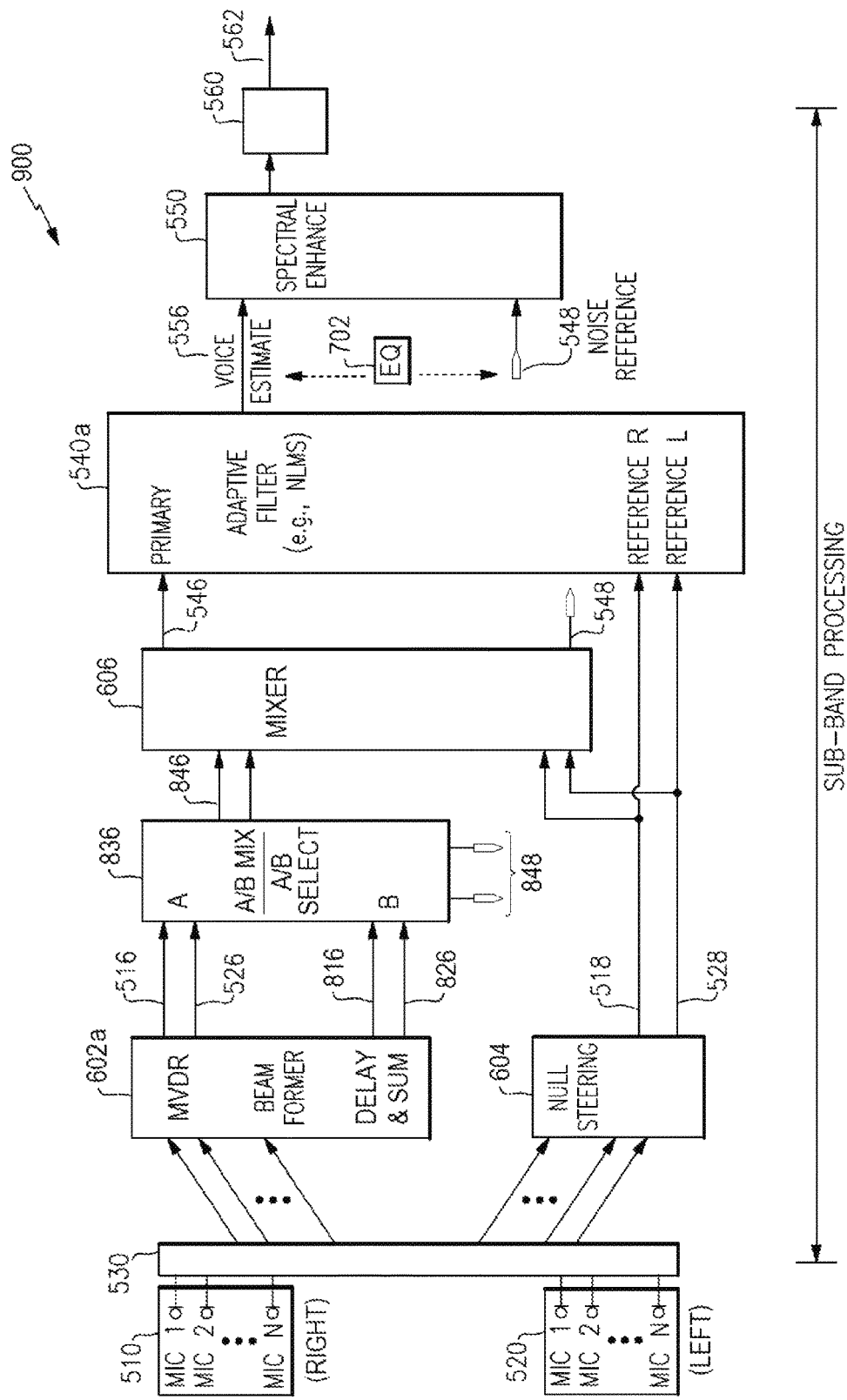
FIG. 9 is a schematic diagram of another example system to enhance a user's voice.

FIG. 9 illustrates an example system 900 that includes a multi-reference adaptive filter 540a, similar to that of the system 700 of FIG. 7A, and includes a multi-beam processor 602a and a selector 836, similar to those of the system 800 of FIG. 8A. Accordingly, the system 900 operates similar to, and provides the benefits of, the systems 700, 800 as discussed above.

Figure 10:
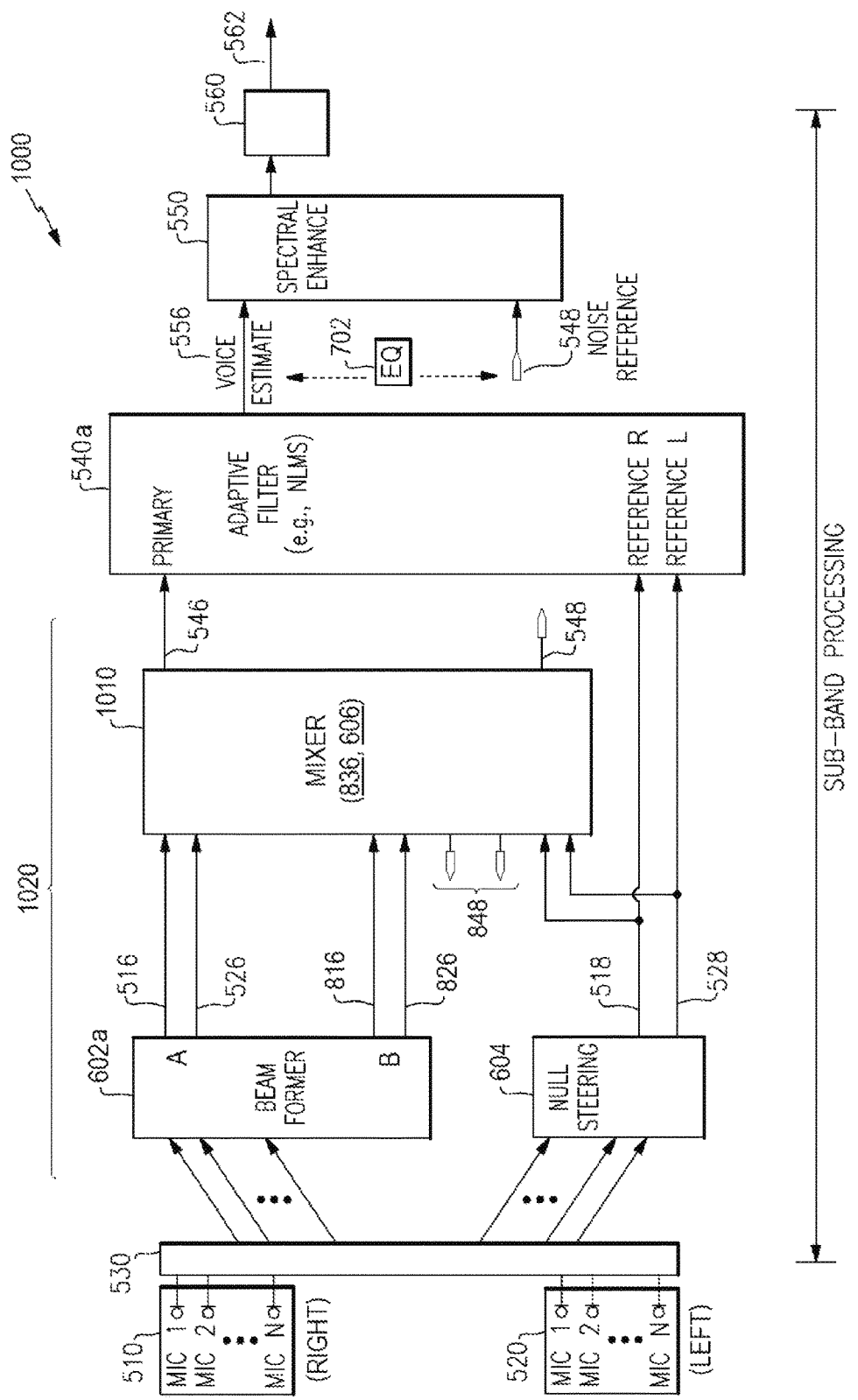
FIG. 10 is a schematic diagram of another example system to enhance a user's voice.

FIG. 10 illustrates a further example system 1000 that is similar to that of FIG. 9 but illustrates the selector 836 and the mixer 606 as a single mixing block 1010 (e.g., a microphone mixer), as the operation of the selector 836 and the mixer 606 cooperate to select and provide weighted mixes of array processed signals, and therefore may be considered to have similar "mixing" purposes and/or operation, in some examples.

In some examples, the beam processor 602, null processor 604, and mixing block 1010 may collectively be considered a processing block 1020 that collectively receives signals from the microphone arrays 510, 520, and provides a primary signal and noise reference signals to a noise canceller (e.g., the adaptive filter 540a), and optionally provides one or more wind flags 848, and/or a noise estimate signal that may be applied for spectral enhancement.

According to the above described example systems, wind flags 848 may be provided by various processing to detect wind (e.g., by the comparison blocks 840 of the selector 836 in some examples) and provided to various other system components, such as a voice activity detector, an adaptive filter, and a spectral enhancer. Additionally, such a voice activity detector may further provide a VAD flag to the adaptive filter and the spectral enhancer. In some examples, a voice activity detector may also provide a noise flag to the adaptive filter and the spectral enhancer, which may indicate when excessive noise is present. In various examples, a far end voice activity flag may be provided, by a remote detector and/or by a local detector processing signals from the remote end, and the far end voice activity flag may be provided to the adaptive filter and the spectral enhancer. In various examples, wind, noise, and voice activity flags may be used by the adaptive filter and the spectral enhancer to alter their processing, e.g., to switch to monaural processing, to freeze filter adaptation(s), to calculate equalization, etc.

In various examples, a binaural system (e.g., example systems 500, 600, 700, 800, 900, 1000) processes signals from one or more right and left microphones (e.g., right microphone array 510, left microphone array 520) to provide various primary, reference, voice estimate, noise estimate signals, and the like. Each of the right and left processing may operate independently in various examples, and various examples may accordingly operate as two monaural systems operating in parallel, to a point, and either of which may be controlled to terminate operation at any time to result in a monaural processing system. In at least one example, monaural operation may be achieved by the mixer 606 weighting 100% to either of the right or left sides (e.g., with reference to FIG. 6, combiners 542, 544 accepting or passing only their respective right signals, or only their left signals). In other examples, further processing of one of the sides (right or left) may be terminated to conserve energy and/or avoid instability (e.g., excessive feedback when an earcup is removed from the head, for instance). Conditions for switching to monaural operation may include, but are not limited to, detected wind on one side, detected lesser wind on one side, detection that an earpiece or earcup has been removed from the user's head (e.g., off-head detection, as described in more detail below), detection of malfunction on one side, detection of high noise in one or more microphones, detection of an unstable transfer function and/or feedback through one or more microphones or processing blocks, or any of various other conditions. Additionally, certain examples may include systems that have only monaural processing by design or are only monaural in nature, e.g., for use on a single side of the head, for example, or for use as a mobile, portable, or personal audio device with monaural voice pickup processing. In the above examples, an example of monaural operation or a monaural system may be had by ignoring one of the "left" or "right" components in the figures and their descriptions where the figure or description otherwise includes a left and a right.

In certain examples, a binaural system may include on-head/off-head detection to detect whether either or both sides of a headphone set are removed from proximity to the user's ear or head, e.g., donned of doffed, (or improperly positioned, in some cases) and in the case of a single side being off-head (e.g., removed or improperly placed) the binaural system may switch to monaural operation (e.g., similar to FIGS. 3-4, and optionally including a selector 836 to compare differing array processing techniques and/or to detect wind on the single on-head side, and/or including other components of the various figures compatible with monaural operation). Detection of an off-head or improper placement condition may include various techniques. For example, physical detection may include detecting that an earpiece is in a parked position (e.g., an earbud "parked" to neckware that is part of the system via a magnet) or stored in a case (e.g., in the case of wirelessly distinct left and right earpieces). Other physical detection may include switch-based sensing triggered by mechanical capture or electrical contact to sense position or contact with the user's head and/or a parked location. In some examples, removal of an earpiece or an earcup may cause variation or instability in noise reduction (ANR) systems, which may be detected in various ways, including detecting an oscillation or tone indicative of an instability. Further, removal of an earpiece or earcup may change a frequency response in the coupling of a driver to an internal microphone (e.g., for feedback ANR) and/or an external microphone (e.g., for feedforward ANR). For example, removal may increase acoustic coupling between the driver and external microphones and may decrease acoustic coupling between the driver and internal microphones. Accordingly, detecting a shift in such couplings may indicate the earpiece or earcup is, or is being, donned or doffed. In some cases, direct measurement or monitoring of such transfer functions may be difficult, thus changes in the transfer functions may be monitored indirectly by observing changes in the behavior of a feedback loop, in some examples. Various methods of detecting position of a personal acoustic device may include capacitive sensing, magnetic sensing, infrared (IR) sensing, or other techniques. In some examples, a power save mode and/or system shutdown (optionally with a delay timer) may be triggered by detecting that both sides, e.g., the entire headphone set, are off-head.

Further aspects of one or more off-head detection systems may be found in U.S. Pat. No. 9,860,626 titled ON/OFF HEAD DETECTION OF PERSONAL ACOUSTIC DEVICE, in U.S. Pat. Nos. 8,238,567; 8,699,719; 8,243,946; and 8,238,570, each titled PERSONAL ACOUSTIC DEVICE POSITION DETERMINATION, and in U.S. Pat. No. 9,894,452 titled OFF-HEAD DETECTION OF IN-EAR HEADSET.

Certain examples may include echo cancellation, in addition to the noise cancellation (e.g., reduction) provided by the adaptive filter 540, 540*a*. Echo components may be included in one or more microphone signals due to coupling between an acoustic driver and any of the microphones. One or more playback signals may be provided to one or more acoustic drivers, such as for playback of an audio program and/or for listening to a far-end conversation partner, and components of the playback signal may be injected into the microphone signals, e.g., by acoustic or direct coupling, and may be called an echo component. Accordingly, reduction of such an echo component may be provided by an echo canceller, which may operate on signals within the various systems described herein, for example, prior to or following processing by the adaptive filter 540, 540*a* (e.g., a noise canceller). In some examples, a first echo canceller may operate on right side signals and a second echo canceller may operate on left side signals. In some examples, one or more echo cancellers may receive a playback signal as an echo reference signal, and may adaptively filter the echo reference signal to produce an estimated echo signal, and may subtract the estimated echo signal from a primary and/or voice estimate signal. In some examples, one or more echo cancellers may pre-filter an echo reference signal to provide a first estimated echo signal, then adaptively filter the first estimated echo signal to provide a final estimated echo signal. Such a pre-filter may model a nominal transfer function between an acoustic driver and one or more microphones, or an array of microphones, and such an adaptive filter may accommodate variations in actual transfer function from those of the nominal transfer function. In some examples, pre-filtering for a nominal transfer function may include loading pre-configured filter coefficients into an adaptive filter, the pre-configured filter coefficients representing the nominal transfer function. Further details of echo cancellation, with integration to binaural noise reduction systems as described herein, may be had with reference to U.S. patent application Ser. No. 15/925,102 titled ECHO CONTROL IN BINAURAL ADAPTIVE NOISE CANCELLATION SYSTEMS IN HEADSETS, filed on even date herewith, and hereby incorporated by reference in its entirety for all purposes.

Certain examples may include a low power or standby mode to reduce energy consumption and/or prolong the life of an energy source, such as a battery. For example, and as discussed above, a user may be required to press a button (e.g., Push-to-Talk (PTT)) or say a wake-up command before talking. In such cases, the example systems may remain in a disabled, standby, or low power state until the button is pressed or the wake-up command is received. Upon receipt of an indication that the system is required to provide enhanced voice (e.g., button press or wake-up command) the various components of the example systems may be powered up, turned on, or otherwise activated. Also as discussed previously, a brief pause may be enforced to establish weights and/or filter coefficients of an adaptive filter based upon background noise (e.g., without the user's voice) and/or to establish binaural weighting by, e.g., the weighting calculator 570 or the mixers 606, 836, 1010, based upon various factors, e.g., wind or high noise from the right or left side. Additional examples include the various components remaining in a disabled, standby, or low power state until voice activity is detected, such as with a voice activity detection module as briefly discussed above.

One or more of the above described systems and methods, in various examples and combinations, may be used to capture the voice of a headphone user and isolate or enhance the user's voice relative to background noise, echoes, and other talkers. Any of the systems and methods described, and variations thereof, may be implemented with varying levels of reliability based on, e.g., microphone quality, microphone placement, acoustic ports, headphone frame design, threshold values, selection of adaptive, spectral, and other algorithms, weighting factors, window sizes, etc., as well as other criteria that may accommodate varying applications and operational parameters.

It is to be understood that any of the functions of methods and components of systems disclosed herein may be implemented or carried out in a digital signal processor (DSP), a microprocessor, a logic controller, logic circuits, and the like, or any combination of these, and may include analog circuit components and/or other components with respect to any particular implementation. Any suitable hardware and/or software, including firmware and the like, may be configured to carry out or implement components of the aspects and examples disclosed herein.

Having described above several aspects of at least one example, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A headphone comprising:
a plurality of microphones coupled to one or more earpieces to provide a plurality of signals; and
one or more processors configured to:
receive the plurality of signals,
process the plurality of signals using a first array processing technique to provide a first enhanced user voice response from a selected direction as a primary signal,
process the plurality of signals using a second array processing technique to provide a second enhanced user voice response from the selected direction as a secondary signal,
compare the primary signal and the secondary signal, and
provide a selected signal based upon the primary signal, the secondary signal, and the comparison.

2. The headphone of claim 1 wherein the one or more processors is further configured to make a threshold comparison of signal energies, the threshold comparison being a determination whether one of the primary signal or the secondary signal has a signal energy less than a threshold amount of a signal energy of the other.

3. The headphone of claim 2 wherein the one or more processors is further configured to select the one of the primary signal and the secondary signal having the lesser signal energy, by threshold comparison, to be provided as the selected signal.

4. The headphone of claim 1 wherein the one or more processors is further configured to apply equalization to at least one of the primary signal and the secondary signal prior to comparing signal energies.

5. The headphone of claim 1 wherein the one or more processors is further configured to indicate a wind condition based upon the comparison.

6. The headphone of claim 5 wherein the first array processing technique is a super-directive beamforming technique and the second array processing technique is a delay-and-sum technique, and the one or more processors is further configured to determine that the wind condition exists based upon a signal energy of the primary signal exceeding a threshold signal energy, the threshold signal energy being based upon a signal energy of the secondary signal.

7. The headphone of claim 1 wherein the one or more processors is further configured to process the plurality of signals to reduce response from the selected direction to provide a reference signal and to subtract, from the selected signal, components correlated to the reference signal.

8. A method of enhancing speech of a headphone user, the method comprising:
receiving a plurality of microphone signals;
array processing the plurality of signals by a first array technique to enhance acoustic response from a direction of the user's mouth to generate a first primary signal having a first enhanced voice response;
array processing the plurality of signals by a second array technique to enhance acoustic response from the direction of the user's mouth to generate a second primary signal having a second enhanced voice response;
comparing the first primary signal to the second primary signal; and
providing a selected primary signal based upon the first primary signal, the second primary signal, and the comparison.

9. The method of claim 8 wherein providing the selected primary signal based upon the comparison comprises providing a selected one of the first primary signal and the second primary signal having a signal energy less than a threshold amount of the other of the first primary signal and the second primary signal.

10. The method of claim 8 further comprising equalizing at least one of the first primary signal and the second primary signal prior to comparing signal energies.

11. The method of claim 8 further comprising determining that a wind condition exists based upon the comparison and setting an indicator that the wind condition exists.

12. The method of claim 11 wherein the first array technique is a super-directive beamforming technique and the second array technique is a delay-and-sum technique, and determining that a wind condition exists comprises determining that a signal energy of the first primary signal exceeds a threshold signal energy, the threshold signal energy being based upon a signal energy of the second primary signal.

13. The method of claim 8 further comprising array processing the plurality of signals to reduce acoustic response from a direction of the user's mouth to generate a noise reference signal, filtering the noise reference signal to generate a noise estimate signal, and subtracting the noise estimate signal from the selected primary signal.

14. A headphone system, comprising: a plurality of left microphones coupled to a left earpiece to provide a plurality of left signals; a plurality of right microphones coupled to a right earpiece to provide a plurality of right signals; and one or more processors configured to: combine the plurality of left signals to enhance acoustic response from a direction of the user's mouth to generate a left primary signal, combine the plurality of left signals to enhance acoustic response from the direction of the user's mouth to generate a left secondary signal, combine the plurality of right signals to enhance acoustic response from the direction of the user's mouth to generate a right primary signal, combine the plurality of right signals to enhance acoustic response from the direction of the user's mouth to generate a right secondary signal, compare the left primary signal and the left secondary signal, compare the right primary signal and the right secondary signal, provide a left signal based upon the left primary signal, the left secondary signal, and the comparison of the left primary signal and the left secondary signal, and provide a right signal based upon the right primary signal, the right secondary signal, and the comparison of the right primary signal and the right secondary signal.

15. The headphone system of claim 14 wherein the one or more processors is further configured to compare the left primary signal and the left secondary signal by signal energies, and to compare the right primary signal and the right secondary signal by signal energies.

16. The headphone system of claim 15 wherein the one or more processors is further configured to make a threshold comparison of signal energies, a threshold comparison being a determination whether a first signal has a signal energy less than a threshold amount of a signal energy of a second signal.

17. The headphone system of claim 16 wherein the threshold comparison comprises equalizing at least one of the first signal and the second signal prior to comparing signal energies.

18. The headphone system of claim 15 wherein the one or more processors is further configured to indicate a wind condition in either of a left or right side based upon at least one of the comparisons.

\* \* \* \* \*